United States Patent
Perkins et al.

(10) Patent No.: US 11,508,861 B1
(45) Date of Patent: Nov. 22, 2022

(54) PHOTOVOLTAIC MODULE WITH LIGHT-SCATTERING ENCAPSULANT PROVIDING SHINGLE-MIMICKING APPEARANCE

(71) Applicant: GAF Energy LLC, Parsippany, NJ (US)

(72) Inventors: Richard Perkins, San Jose, CA (US); Alex Sharenko, Berkeley, CA (US); Thierry Nguyen, San Francisco, CA (US); Gabriela Bunea, San Jose, CA (US); Anna Wojtowicz, San Francisco, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/830,094

(22) Filed: Jun. 1, 2022

Related U.S. Application Data

(60) Provisional application No. 63/196,032, filed on Jun. 2, 2021.

(51) Int. Cl.
| | |
|---|---|
| *H01L 31/048* | (2014.01) |
| *H02S 40/20* | (2014.01) |
| *H02S 20/25* | (2014.01) |
| *H01L 31/18* | (2006.01) |

(52) U.S. Cl.
CPC ............ *H01L 31/048* (2013.01); *H01L 31/18* (2013.01); *H02S 20/25* (2014.12); *H02S 40/20* (2014.12)

(58) Field of Classification Search
None
See application file for complete search history.

(56) References Cited

U.S. PATENT DOCUMENTS

| | | |
|---|---|---|
| 1,981,467 A | 11/1934 | Radtke |
| 3,156,497 A | 11/1964 | Lessard |
| 4,258,948 A | 3/1981 | Hoffmann |

(Continued)

FOREIGN PATENT DOCUMENTS

| | | |
|---|---|---|
| CA | 2829440 C | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Shannon M Gardner
(74) *Attorney, Agent, or Firm* — Greenberg Traurig, LLP

(57) ABSTRACT

A method of making a photovoltaic module includes the step of obtaining a frontsheet having a glass layer, a light scattering encapsulant layer, and a polymer layer. The light scattering encapsulant layer includes a first region, a plurality of first portions extending from the first region, and at least one area located between the first portions. The first portions of the light scattering encapsulant layer has a first light scattering value and a second portion defined by the area has a second light scattering value different from the first light scattering value. The method includes the steps of obtaining at least one solar cell, an encapsulant, and a backsheet, and laminating the frontsheet, the encapsulant, the at least one solar cell, and the backsheet.

20 Claims, 5 Drawing Sheets

(56) References Cited

U.S. PATENT DOCUMENTS

| | | |
|---|---|---|
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,590,495 A | 1/1997 | Bressler et al. |
| 5,642,596 A | 7/1997 | Waddington |
| 6,008,450 A | 12/1999 | Ohtsuka et al. |
| 6,046,399 A | 4/2000 | Kapner |
| 6,320,114 B1 | 11/2001 | Kuechler |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,187,005 B2 | 1/2019 | Rodrigues et al. |
| 10,256,765 B2 | 4/2019 | Rodrigues et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2005/0115603 A1 | 6/2005 | Yoshida et al. |
| 2005/0144870 A1 | 7/2005 | Dinwoodie |
| 2006/0042683 A1 | 3/2006 | Gangemi |
| 2007/0181174 A1 | 8/2007 | Ressler |
| 2007/0193618 A1 | 8/2007 | Bressler et al. |
| 2008/0006323 A1 | 1/2008 | Kalkanoglu et al. |
| 2008/0035140 A1 | 2/2008 | Placer et al. |
| 2008/0315061 A1 | 2/2008 | Placer et al. |
| 2008/0271774 A1 | 11/2008 | Kalkanoglu et al. |
| 2009/0000222 A1 | 1/2009 | Kalkanoglu et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2010/0101634 A1 | 4/2010 | Frank et al. |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0239555 A1 | 10/2011 | Cook et al. |
| 2011/0302859 A1 | 12/2011 | Crasnianski |
| 2012/0060902 A1 | 3/2012 | Drake |

(56) References Cited

U.S. PATENT DOCUMENTS

| | | |
|---|---|---|
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0254776 A1 | 9/2014 | O'Connor et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179726 A1 | 6/2017 | Garrity et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0351502 A1 | 12/2018 | Almy et al. |
| 2019/0030867 A1 | 1/2019 | Sun et al. |
| 2019/0081436 A1 | 3/2019 | Onodi et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |

FOREIGN PATENT DOCUMENTS

| | | |
|---|---|---|
| CN | 202797032 U | 3/2013 |
| DE | 1958248 A1 | 11/1971 |
| EP | 1837162 A1 | 9/2007 |
| EP | 1774372 A1 | 7/2011 |
| EP | 2784241 A1 | 10/2014 |
| JP | 2001-098703 A | 10/2002 |
| JP | 2017-027735 A | 2/2017 |
| WO | 2011/049944 A1 | 4/2011 |
| WO | 2015/133632 A1 | 9/2015 |
| WO | 2019/201416 A1 | 10/2019 |

OTHER PUBLICATIONS

RGS Energy, 3.5kW POWERHOUSE 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

PHOTOVOLTAIC MODULE WITH LIGHT-SCATTERING ENCAPSULANT PROVIDING SHINGLE-MIMICKING APPEARANCE

CROSS-REFERENCE TO RELATED APPLICATION

This application is a Section 111(a) application relating to and claiming the benefit of commonly-owned, co-pending U.S. Provisional Patent Application Ser. No. 63/196,032, filed Jun. 2, 2021, entitled "PHOTOVOLTAIC MODULE WITH LIGHT-SCATTERING ENCAPSULANT PROVIDING SHINGLE-MIMICKING APPEARANCE," the contents of which are incorporated herein by reference in its entirety.

FIELD

The present invention relates to roof-integrated photovoltaic modules. More particularly, the present invention relates to roof-integrated photovoltaic modules with light-scattering encapsulants providing a non-uniform or randomized appearance, and roofing systems including such modules.

BACKGROUND

Photovoltaic modules can be placed on building roofs (e.g., residential roofs) to generate electricity. One obstacle to mass-market adoption of solar roofing is poor aesthetics. Standard rack-mounted photovoltaic ("PV") systems have a very different appearance than traditional roofing materials (e.g., asphalt shingles, wooden shingles, slate shingles, etc.), which can draw unwanted attention. Even low-profile PV systems still receive poor aesthetic feedback from consumers.

SUMMARY

In some embodiments, a method of making a photovoltaic module, comprising the steps of obtaining a frontsheet, wherein the frontsheet includes a glass layer having a first surface, a light scattering encapsulant layer having a first surface and a second surface opposite the first surface of the light scattering encapsulant layer, wherein the second surface of the light scattering encapsulant layer is attached to the first surface of the glass layer, wherein the light scattering encapsulant layer includes a first region, a plurality of portions extending from the first region, and at least one area located between the portions, a polymer layer having a first surface and a second surface opposite the first surface of the polymer layer, wherein the second surface of the polymer layer is attached to the first surface of the light scattering encapsulant layer, and wherein the plurality of portions of the light scattering encapsulant layer has a first light scattering value as measured in accordance with an ASTM E430 standard, wherein a portion defined by the at least one area has a second light scattering value as measured in accordance with the ASTM E430 standard, and wherein the second light scattering value is different than the first light scattering value; obtaining at least one solar cell, an encapsulant, and a backsheet wherein the encapsulant includes a first surface and a second surface opposite the first surface of the encapsulant; and laminating the frontsheet, the encapsulant, the at least one solar cell, and the backsheet, wherein the frontsheet is juxtaposed with the first surface of the encapsulant, wherein the encapsulant encapsulates the at least one solar cell, and wherein the backsheet is juxtaposed with the second surface of the encapsulant.

In some embodiments, the method further comprises the steps of laminating the glass layer, the light scattering encapsulant layer, and the polymer layer to form the frontsheet. In some embodiments, the first light scattering value is 0.1 HU to 12 HU. In some embodiments, the second light scattering value is 0.1 HU to 12 HU. In some embodiments, the polymer layer is attached to the light scattering encapsulant layer by an adhesive layer. In some embodiments, the adhesive layer is selected from the group consisting of thermosetting polyolefin, thermosetting polyolefin encapsulant material, ethylene-vinyl acetate (EVA), EVA encapsulants, thermoplastic olefin, thermoplastic polyolefin (TPO) and hybrids and combinations thereof. In some embodiments, the adhesive layer includes a thermosetting polyolefin encapsulant material. In some embodiments, the polymer layer includes a fluoropolymer. In some embodiments, the polymer layer includes a material selected from the group consisting of acrylics, polyesters, silicones, and polycarbonates.

In some embodiments, the light scattering encapsulant layer includes a polymeric material. In some embodiments, the polymeric material includes at least one of ethylene-co-vinyl acetate, polydimethyl siloxane, a polyolefin elastomer, or a combination thereof. In some embodiments, the backsheet includes a first layer juxtaposed with the second surface of the encapsulant. In some embodiments, the first layer includes thermoplastic polyolefin (TPO). In some embodiments, In some embodiments, the backsheet includes a second layer. In some embodiments, the second layer includes thermoplastic polyolefin (TPO). In some embodiments, the first layer is attached to the second layer by a second adhesive layer. In some embodiments, the second adhesive layer is selected from the group consisting of thermosetting polyolefin, thermosetting polyolefin encapsulant material, thermosetting polyolefin encapsulant material, ethylene-vinyl acetate (EVA), EVA encapsulants, thermoplastic olefin, thermoplastic polyolefin (TPO) and hybrids and combinations thereof.

In some embodiments, a system includes a plurality of photovoltaic modules installed on a roof deck, wherein each of the photovoltaic modules includes at least one solar cell; an encapsulant encapsulating the at least one solar cell; and a frontsheet juxtaposed with the encapsulant, wherein the frontsheet includes a glass layer having a first surface, a light scattering encapsulant layer having a first surface and a second surface opposite the first surface of the light scattering encapsulant layer, wherein the second surface of the light scattering encapsulant layer is attached to the first surface of the glass layer, wherein the light scattering encapsulant layer includes a first region, a plurality of portions extending from the first region, and at least one area located between the portions, a polymer layer having a first surface and a second surface opposite the first surface of the polymer layer, wherein the second surface of the polymer layer is attached to the first surface of the light scattering encapsulant layer, and wherein the plurality of portions of the light scattering encapsulant layer has a first light scattering value as measured in accordance with an ASTM E430 standard, wherein a portion defined by the at least one area has a second light scattering value as measured in accordance with the ASTM E430 standard, and wherein the second light scattering value is different than the first light scattering value. In some embodiments, at least one of the photovoltaic modules has a solar reflectivity index (SRI) greater than 16. In some embodiments, the difference between the first light scattering value and the second light scattering value imparts a random appearance to the system.

DETAILED DESCRIPTION

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in another embodiment" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
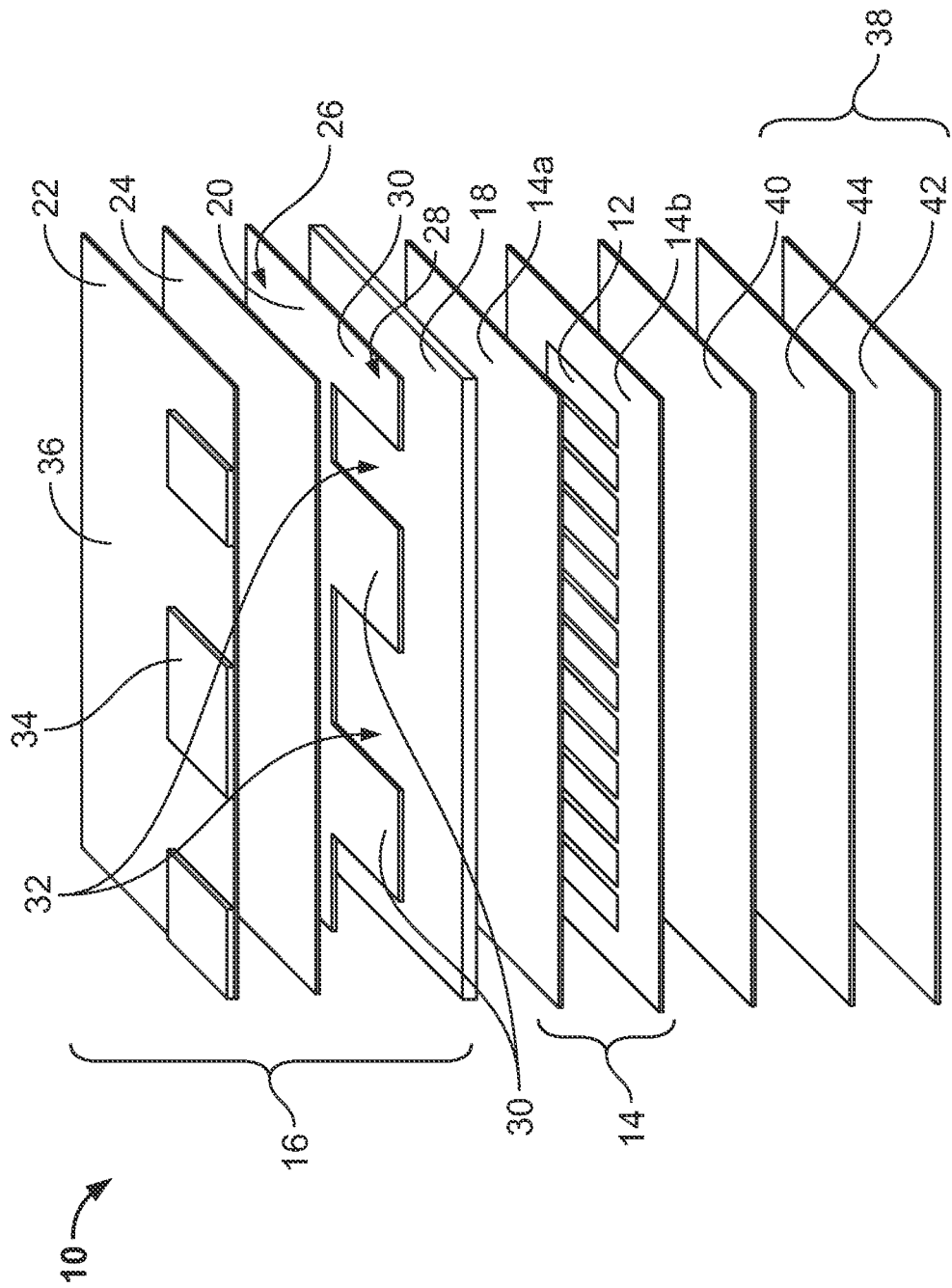
FIG. 1 shows an exploded perspective view of an embodiment of a photovoltaic module.
Figure 2:
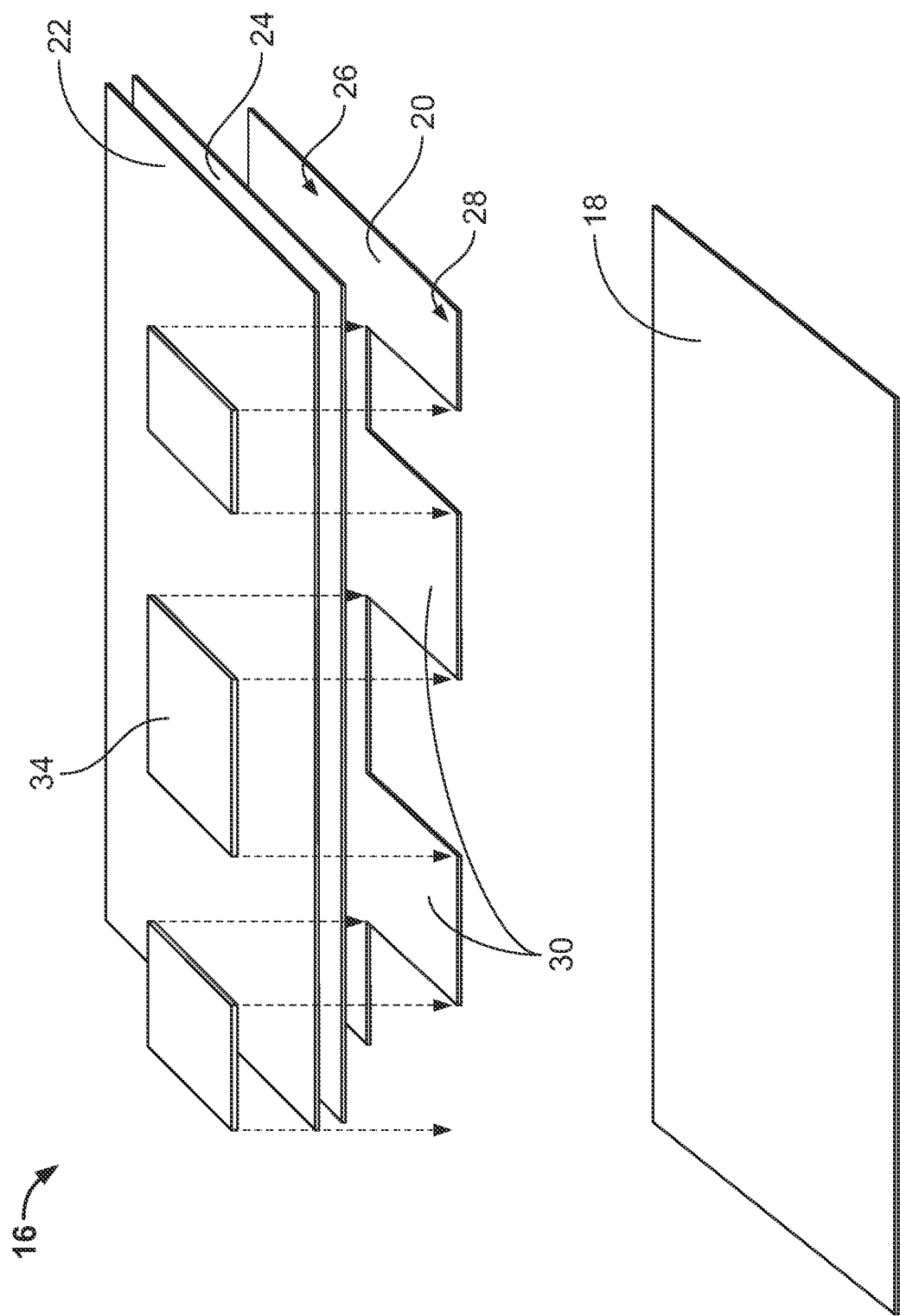
FIG. 2 shows an exploded perspective view of a light scattering portion of the photovoltaic module shown in FIG. 1.
Figure 3:
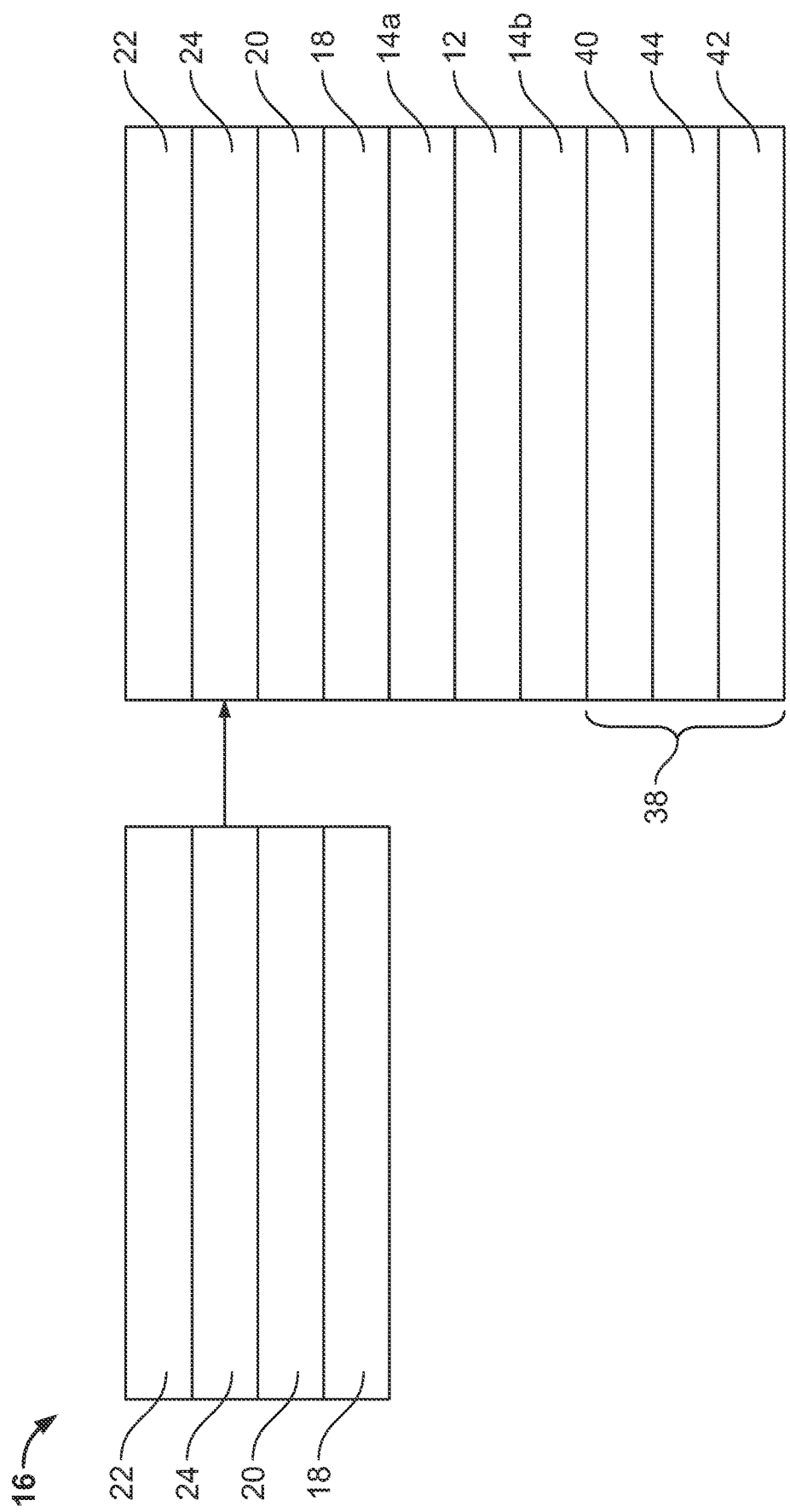
FIG. 3 shows a schematic view of steps of a lamination process of the photovoltaic module shown in FIG. 1.

Referring to FIGS. 1 through 3, in an embodiment, a photovoltaic module 10 includes a plurality of solar cells 12, an encapsulant 14 encapsulating the at least one solar cell 12, and a frontsheet 16 juxtaposed with the encapsulant 14. As used herein, the terms "encapsulating" and "encapsulates" mean to partially or fully envelope or enclose, and with respect to certain embodiments of the photovoltaic module 10, the at least one solar cell 12 is fully enveloped by or enclosed within the encapsulant 14, or partially enveloped by or enclosed within the encapsulant 14. In an embodiment, the encapsulant 14 includes a first layer 14a and a second layer 14b.

In an embodiment, the encapsulant 14 may be made from polyolefins, ethyl vinyl acetates, ionomers, silicones, poly vinyl butyral, epoxies, polyurethanes, or combinations/hybrids thereof. In an embodiment, the encapsulant 14 is made from thermosetting polyolefin.

In an embodiment, the encapsulant 14 has a thickness of 0.4 mm to 1.8 mm. In another embodiment, the encapsulant 14 has a thickness of 0.4 mm to 1.7 mm. In another embodiment, the encapsulant 14 has a thickness of 0.4 mm to 1.6 mm. In another embodiment, the encapsulant 14 has a thickness of 0.4 mm to 1.5 mm. In another embodiment, the encapsulant 14 has a thickness of 0.4 mm to 1.4 mm. In another embodiment, the encapsulant 14 has a thickness of 0.4 mm to 1.3 mm. In another embodiment, the encapsulant 14 has a thickness of 0.4 mm to 1.2 mm. In another embodiment, the encapsulant 14 has a thickness of 0.4 mm to 1.1 mm. In another embodiment, the encapsulant 14 has a thickness of 0.4 mm to 1.0 mm. In another embodiment, the encapsulant 14 has a thickness of 0.4 mm to 0.9 mm. In another embodiment, the encapsulant 14 has a thickness of 0.4 mm to 0.8 mm. In another embodiment, the encapsulant 14 has a thickness of 0.4 mm to 0.7 mm. In another embodiment, the encapsulant 14 has a thickness of 0.4 mm to 0.6 mm. In another embodiment, the encapsulant 14 has a thickness of 0.4 mm to 0.5 mm.

In an embodiment, the encapsulant 14 has a thickness of 0.5 mm to 1.8 mm. In another embodiment, the encapsulant 14 has a thickness of 0.5 mm to 1.7 mm. In another embodiment, the encapsulant 14 has a thickness of 0.5 mm to 1.6 mm. In another embodiment, the encapsulant 14 has a thickness of 0.5 mm to 1.5 mm. In another embodiment, the encapsulant 14 has a thickness of 0.5 mm to 1.4 mm. In another embodiment, the encapsulant 14 has a thickness of 0.5 mm to 1.3 mm. In another embodiment, the encapsulant 14 has a thickness of 0.5 mm to 1.2 mm. In another embodiment, the encapsulant 14 has a thickness of 0.5 mm to 1.1 mm. In another embodiment, the encapsulant 14 has a thickness of 0.5 mm to 1.0 mm. In another embodiment, the encapsulant 14 has a thickness of 0.5 mm to 0.9 mm. In another embodiment, the encapsulant 14 has a thickness of 0.5 mm to 0.8 mm. In another embodiment, the encapsulant 14 has a thickness of 0.5 mm to 0.7 mm. In another embodiment, the encapsulant 14 has a thickness of 0.5 mm to 0.6 mm.

In an embodiment, the encapsulant 14 has a thickness of 0.6 mm to 1.8 mm. In another embodiment, the encapsulant 14 has a thickness of 0.6 mm to 1.7 mm. In another embodiment, the encapsulant 14 has a thickness of 0.6 mm to 1.6 mm. In another embodiment, the encapsulant 14 has a thickness of 0.6 mm to 1.5 mm. In another embodiment, the encapsulant 14 has a thickness of 0.6 mm to 1.4 mm. In another embodiment, the encapsulant 14 has a thickness of 0.6 mm to 1.3 mm. In another embodiment, the encapsulant 14 has a thickness of 0.6 mm to 1.2 mm. In another embodiment, the encapsulant 14 has a thickness of 0.6 mm to 1.1 mm. In another embodiment, the encapsulant 14 has a thickness of 0.6 mm to 1.0 mm. In another embodiment, the encapsulant 14 has a thickness of 0.6 mm to 0.9 mm. In another embodiment, the encapsulant 14 has a thickness of 0.6 mm to 0.8 mm. In another embodiment, the encapsulant 14 has a thickness of 0.6 mm to 0.7 mm.

In an embodiment, the encapsulant 14 has a thickness of 0.7 mm to 1.8 mm. In another embodiment, the encapsulant 14 has a thickness of 0.7 mm to 1.7 mm. In another embodiment, the encapsulant 14 has a thickness of 0.7 mm to 1.6 mm. In another embodiment, the encapsulant 14 has a thickness of 0.7 mm to 1.5 mm. In another embodiment, the encapsulant 14 has a thickness of 0.7 mm to 1.4 mm. In another embodiment, the encapsulant 14 has a thickness of 0.7 mm to 1.3 mm. In another embodiment, the encapsulant 14 has a thickness of 0.7 mm to 1.2 mm. In another embodiment, the encapsulant 14 has a thickness of 0.7 mm to 1.1 mm. In another embodiment, the encapsulant 14 has a thickness of 0.7 mm to 1.0 mm. In another embodiment, the encapsulant 14 has a thickness of 0.7 mm to 0.9 mm. In another embodiment, the encapsulant 14 has a thickness of 0.7 mm to 0.8 mm.

In an embodiment, the encapsulant 14 has a thickness of 0.8 mm to 1.8 mm. In another embodiment, the encapsulant 14 has a thickness of 0.8 mm to 1.7 mm. In another embodiment, the encapsulant 14 has a thickness of 0.8 mm to 1.6 mm. In another embodiment, the encapsulant 14 has a thickness of 0.8 mm to 1.5 mm. In another embodiment, the encapsulant 14 has a thickness of 0.8 mm to 1.4 mm. In another embodiment, the encapsulant 14 has a thickness of 0.8 mm to 1.3 mm. In another embodiment, the encapsulant 14 has a thickness of 0.8 mm to 1.2 mm. In another embodiment, the encapsulant 14 has a thickness of 0.8 mm to 1.1 mm. In another embodiment, the encapsulant 14 has a thickness of 0.8 mm to 1.0 mm. In another embodiment, the encapsulant 14 has a thickness of 0.8 mm to 0.9 mm.

In an embodiment, the encapsulant 14 has a thickness of 0.9 mm to 1.8 mm. In another embodiment, the encapsulant 14 has a thickness of 0.9 mm to 1.7 mm. In another embodiment, the encapsulant 14 has a thickness of 0.9 mm to 1.6 mm. In another embodiment, the encapsulant 14 has a thickness of 0.9 mm to 1.5 mm. In another embodiment, the encapsulant 14 has a thickness of 0.9 mm to 1.4 mm. In another embodiment, the encapsulant 14 has a thickness of 0.9 mm to 1.3 mm. In another embodiment, the encapsulant 14 has a thickness of 0.9 mm to 1.2 mm. In another embodiment, the encapsulant 14 has a thickness of 0.9 mm to 1.1 mm. In another embodiment, the encapsulant 14 has a thickness of 0.9 mm to 1.0 mm.

In an embodiment, the encapsulant 14 has a thickness of 1.0 mm to 1.8 mm. In another embodiment, the encapsulant 14 has a thickness of 1.0 mm to 1.7 mm. In another embodiment, the encapsulant 14 has a thickness of 1.0 mm to 1.6 mm. In another embodiment, the encapsulant 14 has a thickness of 1.0 mm to 1.5 mm. In another embodiment, the encapsulant 14 has a thickness of 1.0 mm to 1.4 mm. In another embodiment, the encapsulant 14 has a thickness of 1.0 mm to 1.3 mm. In another embodiment, the encapsulant 14 has a thickness of 1.0 mm to 1.2 mm. In another embodiment, the encapsulant 14 has a thickness of 1.0 mm to 1.1 mm.

In an embodiment, the encapsulant 14 has a thickness of 1.1 mm to 1.8 mm. In another embodiment, the encapsulant 14 has a thickness of 1.1 mm to 1.7 mm. In another embodiment, the encapsulant 14 has a thickness of 1.1 mm to 1.6 mm. In another embodiment, the encapsulant 14 has a thickness of 1.1 mm to 1.5 mm. In another embodiment, the encapsulant 14 has a thickness of 1.1 mm to 1.4 mm. In another embodiment, the encapsulant 14 has a thickness of 1.1 mm to 1.3 mm. In another embodiment, the encapsulant 14 has a thickness of 1.1 mm to 1.2 mm.

In an embodiment, the encapsulant 14 has a thickness of 1.2 mm to 1.8 mm. In another embodiment, the encapsulant 14 has a thickness of 1.2 mm to 1.7 mm. In another embodiment, the encapsulant 14 has a thickness of 1.2 mm to 1.6 mm. In another embodiment, the encapsulant 14 has a thickness of 1.2 mm to 1.5 mm. In another embodiment, the encapsulant 14 has a thickness of 1.2 mm to 1.4 mm. In another embodiment, the encapsulant 14 has a thickness of 1.2 mm to 1.3 mm.

In an embodiment, the encapsulant 14 has a thickness of 1.3 mm to 1.8 mm. In another embodiment, the encapsulant 14 has a thickness of 1.3 mm to 1.7 mm. In another embodiment, the encapsulant 14 has a thickness of 1.3 mm to 1.6 mm. In another embodiment, the encapsulant 14 has a thickness of 1.3 mm to 1.5 mm. In another embodiment, the encapsulant 14 has a thickness of 1.3 mm to 1.4 mm.

In an embodiment, the encapsulant 14 has a thickness of 1.4 mm to 1.8 mm. In another embodiment, the encapsulant 14 has a thickness of 1.4 mm to 1.7 mm. In another embodiment, the encapsulant 14 has a thickness of 1.4 mm to 1.6 mm. In another embodiment, the encapsulant 14 has a thickness of 1.4 mm to 1.5 mm.

In an embodiment, the encapsulant 14 has a thickness of 1.5 mm to 1.8 mm. In another embodiment, the encapsulant 14 has a thickness of 1.5 mm to 1.7 mm. In another embodiment, the encapsulant 14 has a thickness of 1.5 mm to 1.6 mm. In an embodiment, the encapsulant 14 has a thickness of 1.6 mm to 1.8 mm. In another embodiment, the encapsulant 14 has a thickness of 1.6 mm to 1.7 mm. In an embodiment, the encapsulant 14 has a thickness of 1.7 mm to 1.8 mm. In an embodiment, the encapsulant 14 has a thickness of 0.4 mm. In an embodiment, the encapsulant 14 has a thickness of 0.5 mm. In an embodiment, the encapsulant 14 has a thickness of 0.6 mm. In an embodiment, the encapsulant 14 has a thickness of 0.7 mm. In an embodiment, the encapsulant 14 has a thickness of 0.8 mm. In an embodiment, the encapsulant 14 has a thickness of 0.9 mm. In an embodiment, the encapsulant 14 has a thickness of 1.0 mm. In an embodiment, the encapsulant 14 has a thickness of 1.1 mm. In an embodiment, the encapsulant 14 has a thickness of 1.2 mm. In an embodiment, the encapsulant 14 has a thickness of 1.3 mm. In an embodiment, the encapsulant 14 has a thickness of 1.4 mm. In an embodiment, the encapsulant 14 has a thickness of 1.5 mm. In an embodiment, the encapsulant 14 has a thickness of 1.6 mm. In an embodiment, the encapsulant 14 has a thickness of 1.7 mm. In an embodiment, the encapsulant 14 has a thickness of 1.8 mm.

In an embodiment, the first layer 14a of the encapsulant 14 has a thickness of 0.2 mm to 0.9 mm. In another embodiment, the first layer 14a of the encapsulant 14 has a thickness of 0.2 mm to 0.8 mm. In another embodiment, the first layer 14a of the encapsulant 14 has a thickness of 0.2 mm to 0.7 mm. In another embodiment, the first layer 14a of the encapsulant 14 has a thickness of 0.2 mm to 0.6 mm. In another embodiment, the first layer 14a of the encapsulant 14 has a thickness of 0.2 mm to 0.5 mm. In another embodiment, the first layer 14a of the encapsulant 14 has a thickness of 0.2 mm to 0.4 mm. In another embodiment, the first layer 14a of the encapsulant 14 has a thickness of 0.2 mm to 0.3 mm.

In an embodiment, the first layer 14a of the encapsulant 14 has a thickness of 0.3 mm to 0.9 mm. In another embodiment, the first layer 14a of the encapsulant 14 has a thickness of 0.3 mm to 0.8 mm. In another embodiment, the first layer 14a of the encapsulant 14 has a thickness of 0.3 mm to 0.7 mm. In another embodiment, the first layer 14a of the encapsulant 14 has a thickness of 0.3 mm to 0.6 mm. In another embodiment, the first layer 14a of the encapsulant 14 has a thickness of 0.3 mm to 0.5 mm. In another embodiment, the first layer 14a of the encapsulant 14 has a thickness of 0.3 mm to 0.4 mm.

In an embodiment, the first layer 14a of the encapsulant 14 has a thickness of 0.4 mm to 0.9 mm. In another embodiment, the first layer 14a of the encapsulant 14 has a thickness of 0.4 mm to 0.8 mm. In another embodiment, the first layer 14a of the encapsulant 14 has a thickness of 0.4 mm to 0.7 mm. In another embodiment, the first layer 14a of the encapsulant 14 has a thickness of 0.4 mm to 0.6 mm. In another embodiment, the first layer 14a of the encapsulant 14 has a thickness of 0.4 mm to 0.5 mm.

In an embodiment, the first layer 14a of the encapsulant 14 has a thickness of 0.5 mm to 0.9 mm. In another embodiment, the first layer 14a of the encapsulant 14 has a thickness of 0.5 mm to 0.8 mm. In another embodiment, the first layer 14a of the encapsulant 14 has a thickness of 0.5 mm to 0.7 mm. In another embodiment, the first layer 14a of the encapsulant 14 has a thickness of 0.5 mm to 0.6 mm. In an embodiment, the first layer 14a of the encapsulant 14 has a thickness of 0.6 mm to 0.9 mm. In another embodiment, the first layer 14a of the encapsulant 14 has a thickness of 0.6 mm to 0.8 mm. In another embodiment, the first layer 14a of the encapsulant 14 has a thickness of 0.6 mm to 0.7 mm. In another embodiment, the first layer 14a of the encapsulant 14 has a thickness of 0.7 mm to 0.9 mm. In another embodiment, the first layer 14a of the encapsulant 14 has a thickness of 0.7 mm to 0.8 mm. In an embodiment, the first layer 14a of the encapsulant 14 has a thickness of 0.8 mm to 0.9 mm.

In an embodiment, the second layer 14b of the encapsulant 14 has a thickness of 0.2 mm to 0.9 mm. In another embodiment, the second layer 14b of the encapsulant 14 has a thickness of 0.2 mm to 0.8 mm. In another embodiment, the second layer 14b of the encapsulant 14 has a thickness of 0.2 mm to 0.7 mm. In another embodiment, the second layer 14b of the encapsulant 14 has a thickness of 0.2 mm to 0.6 mm. In another embodiment, the second layer 14b of the encapsulant 14 has a thickness of 0.2 mm to 0.5 mm. In another embodiment, the second layer 14b of the encapsulant 14 has a thickness of 0.2 mm to 0.4 mm. In another embodiment, the second layer 14b of the encapsulant 14 has a thickness of 0.2 mm to 0.3 mm.

In another embodiment, the second layer 14b of the encapsulant 14 has a thickness of 0.3 mm to 0.9 mm. In another embodiment, the second layer 14b of the encapsulant 14 has a thickness of 0.3 mm to 0.8 mm. In another embodiment, the second layer 14b of the encapsulant 14 has a thickness of 0.3 mm to 0.7 mm. In another embodiment, the second layer 14b of the encapsulant 14 has a thickness of 0.3 mm to 0.6 mm. In another embodiment, the second layer 14b of the encapsulant 14 has a thickness of 0.3 mm to 0.5 mm. In another embodiment, the second layer 14b of the encapsulant 14 has a thickness of 0.3 mm to 0.4 mm.

In an embodiment, the second layer 14b of the encapsulant 14 has a thickness of 0.4 mm to 0.9 mm. In another embodiment, the second layer 14b of the encapsulant 14 has a thickness of 0.4 mm to 0.8 mm. In another embodiment, the second layer 14b of the encapsulant 14 has a thickness of 0.4 mm to 0.7 mm. In another embodiment, the second layer 14b of the encapsulant 14 has a thickness of 0.4 mm to 0.6 mm. In another embodiment, the second layer 14b of the encapsulant 14 has a thickness of 0.4 mm to 0.5 mm.

In an embodiment, the second layer 14b of the encapsulant 14 has a thickness of 0.5 mm to 0.9 mm. In another embodiment, the second layer 14b of the encapsulant 14 has a thickness of 0.5 mm to 0.8 mm. In another embodiment, the second layer 14b of the encapsulant 14 has a thickness of 0.5 mm to 0.7 mm. In another embodiment, the second layer 14b of the encapsulant 14 has a thickness of 0.5 mm to 0.6 mm. In an embodiment, the second layer 14b of the encapsulant 14 has a thickness of 0.6 mm to 0.9 mm. In another embodiment, the second layer 14b of the encapsulant 14 has a thickness of 0.6 mm to 0.8 mm. In another embodiment, the second layer 14b of the encapsulant 14 has a thickness of 0.6 mm to 0.7 mm. In an embodiment, the second layer 14b of the encapsulant 14 has a thickness of 0.7 mm to 0.9 mm. In another embodiment, the second layer 14b of the encapsulant 14 has a thickness of 0.7 mm to 0.8 mm. In an embodiment, the second layer 14b of the encapsulant 14 has a thickness of 0.8 mm to 0.9 mm.

In an embodiment, the thickness of the first layer 14a is equal to the thickness of the second layer 14b. In another embodiment, the thickness of the first layer 14a is different from the thickness of the second layer 14b.

In an embodiment, the frontsheet 16 includes a glass layer 18, a light scattering encapsulant layer 20 attached to a first surface of the glass layer 18, and a polymer layer 22 attached to a first surface of the light scattering encapsulant layer 20. In an embodiment, the frontsheet 16 is juxtaposed with the first layer 14a of the encapsulant 14. In an embodiment, each of the glass layer 18, the light scattering encapsulant layer 20, and the polymer layer 22 is transparent.

In an embodiment, the light scattering encapsulant layer 20 includes a polymeric material. In an embodiment, the polymeric material includes at least one of ethylene-co-vinyl acetate, polydimethyl siloxane, a polyolefin elastomer, or a combination thereof.

In an embodiment, the polymer layer 22 is attached to the light scattering encapsulant layer 20 and the glass layer 18 by an adhesive layer 24. In an embodiment, the adhesive layer 24 may include polyvinyl butyrate, acrylic, silicone, or polycarbonate. In another embodiment, the adhesive layer 24 may include pressure sensitive adhesives. In another embodiment, the polymer layer 22 is attached to the light scattering encapsulant layer 20 and the glass layer 18 by thermal bonding. In another embodiment, the frontsheet 16 includes at least one of the glass layer 18 or the polymer layer 22.

In an embodiment, the glass layer 18 has a thickness of 2.5 mm to 4 mm. In another embodiment, the glass layer 18 has a thickness of 2.5 mm to 3.5 mm. In another embodiment, the glass layer 18 has a thickness of 2.5 mm to 3 mm. In another embodiment, the glass layer 18 has a thickness of 3 mm to 4 mm. In another embodiment, the glass layer 18 has a thickness of 3.5 mm to 4 mm. In another embodiment, the glass layer 18 has a thickness of 2.6 mm to 3.5 mm. In another embodiment, the glass layer 18 has a thickness of 2.7 mm to 3.5 mm. In another embodiment, the glass layer 18 has a thickness of 2.8 mm to 3.5 mm. In another embodiment, the glass layer 18 has a thickness of 2.9 mm to 3.5 mm. In another embodiment, the glass layer 18 has a thickness of 3 mm to 3.5 mm. In another embodiment, the glass layer 18 has a thickness of 3.1 mm to 3.5 mm. In another embodiment, the glass layer 18 has a thickness of 3.2 mm to 3.5 mm. In another embodiment, the glass layer 18 has a thickness of 3.3 mm to 3.5 mm. In another embodiment, the glass layer 18 has a thickness of 3.4 mm to 3.5 mm. In another embodiment, the glass layer 18 has a thickness of 2.5 mm to 3.4 mm. In another embodiment, the glass layer 18 has a thickness of 2.5 mm to 3.3 mm. In another embodiment, the glass layer 18 has a thickness of 2.5 mm to 3.2 mm. In another embodiment, the glass layer 18 has a thickness of 2.5 mm to 3.1 mm. In another embodiment, the glass layer 18 has a thickness of 2.5 mm to 2.9 mm. In another embodiment, the glass layer 18 has a thickness of 2.5 mm to 2.8 mm. In another embodiment, the glass layer 18 has a thickness of 2.5 mm to 2.7 mm. In another embodiment, the glass layer 18 has a thickness of 2.5 mm to 2.6 mm.

In another embodiment, the glass layer 18 has a thickness of 2.5 mm. In another embodiment, the glass layer 18 has a thickness of 2.6 mm. In another embodiment, the glass layer 18 has a thickness of 2.7 mm. In another embodiment, the glass layer 18 has a thickness of 2.8 mm. In another embodiment, the glass layer 18 has a thickness of 2.9 mm. In another embodiment, the glass layer 18 has a thickness of 3 mm. In another embodiment, the glass layer 18 has a thickness of 3.1 mm. In another embodiment, the glass layer 18 has a thickness of 3.2 mm. In another embodiment, the glass layer 18 has a thickness of 3.3 mm. In another embodiment, the glass layer 18 has a thickness of 3.4 mm. In another embodiment, the glass layer 18 has a thickness of 3.5 mm. In another embodiment, the glass layer 18 has a thickness of 3.6 mm. In another embodiment, the glass layer 18 has a thickness of 3.7 mm. In another embodiment, the glass layer 18 has a thickness of 3.8 mm. In another embodiment, the glass layer 18 has a thickness of 3.9 mm. In another embodiment, the glass layer 18 has a thickness of 4 mm.

In an embodiment, the adhesive layer 24 includes thermosetting polyolefin, thermosetting polyolefin encapsulant material, ethylene-vinyl acetate (EVA), EVA encapsulants, thermoplastic olefin, thermoplastic polyolefin (TPO) or hybrids/combinations thereof.

In an embodiment, the adhesive layer 24 has a thickness of 1 μm to 900 μm. In an embodiment, the adhesive layer 24 has a thickness of 1 μm to 900 μm. In an embodiment, the adhesive layer 24 has a thickness of 1 μm to 850 μm. In an embodiment, the adhesive layer 24 has a thickness of 1 μm to 800 μm. In an embodiment, the adhesive layer 24 has a thickness of 1 μm to 750 μm. In an embodiment, the adhesive layer 24 has a thickness of 1 μm to 700 μm. In an embodiment, the adhesive layer 24 has a thickness of 1 μm to 650 μm. In an embodiment, the adhesive layer 24 has a thickness of 1 μm to 600 μm. In an embodiment, the adhesive layer 24 has a thickness of 1 μm to 550 μm. In an embodiment, the adhesive layer 24 has a thickness of 1 μm to 500 μm. In an embodiment, the adhesive layer 24 has a thickness of 1 μm to 450 μm. In an embodiment, the adhesive layer 24 has a thickness of 1 μm to 400 μm. In an embodiment, the adhesive layer 24 has a thickness of 1 μm to 350 μm. In an embodiment, the adhesive layer 24 has a thickness of 1 μm to 300 μm. In an embodiment, the adhesive layer 24 has a thickness of 1 μm to 250 μm. In an embodiment, the adhesive layer 24 has a thickness of 1 μm to 200 μm. In an embodiment, the adhesive layer 24 has a thickness of 1 μm to 150 μm. In an embodiment, the adhesive layer 24 has a thickness of 1 μm to 100 μm. In an embodiment, the adhesive layer 24 has a thickness of 1 μm to 50 μm.

In an embodiment, the adhesive layer 24 has a thickness of 50 μm to 900 μm. In an embodiment, the adhesive layer 24 has a thickness of 50 μm to 850 μm. In an embodiment, the adhesive layer 24 has a thickness of 50 μm to 800 μm. In an embodiment, the adhesive layer 24 has a thickness of 50 μm to 750 μm. In an embodiment, the adhesive layer 24 has a thickness of 50 μm to 700 μm. In an embodiment, the adhesive layer 24 has a thickness of 50 μm to 650 μm. In an embodiment, the adhesive layer 24 has a thickness of 50 μm to 600 μm. In an embodiment, the adhesive layer 24 has a thickness of 50 μm to 550 μm. In an embodiment, the adhesive layer 24 has a thickness of 50 μm to 500 μm. In an embodiment, the adhesive layer 24 has a thickness of 50 μm to 450 μm. In an embodiment, the adhesive layer 24 has a thickness of 50 μm to 400 μm. In an embodiment, the adhesive layer 24 has a thickness of 50 μm to 350 μm. In an embodiment, the adhesive layer 24 has a thickness of 50 μm to 300 μm. In an embodiment, the adhesive layer 24 has a thickness of 50 μm to 250 μm. In an embodiment, the adhesive layer 24 has a thickness of 50 μm to 200 μm. In an embodiment, the adhesive layer 24 has a thickness of 50 μm to 150 μm. In an embodiment, the adhesive layer 24 has a thickness of 50 μm to 100 μm.

In an embodiment, the adhesive layer 24 has a thickness of 100 μm to 900 μm. In an embodiment, the adhesive layer 24 has a thickness of 100 μm to 850 μm. In an embodiment, the adhesive layer 24 has a thickness of 100 μm to 800 μm. In an embodiment, the adhesive layer 24 has a thickness of 100 μm to 750 μm. In an embodiment, the adhesive layer 24 has a thickness of 100 μm to 700 μm. In an embodiment, the adhesive layer 24 has a thickness of 100 μm to 650 μm. In an embodiment, the adhesive layer 24 has a thickness of 100 μm to 600 μm. In an embodiment, the adhesive layer 24 has a thickness of 100 μm to 550 μm. In an embodiment, the adhesive layer 24 has a thickness of 100 μm to 500 μm. In an embodiment, the adhesive layer 24 has a thickness of 100 μm to 450 μm. In an embodiment, the adhesive layer 24 has a thickness of 100 μm to 400 μm. In an embodiment, the adhesive layer 24 has a thickness of 100 μm to 350 μm. In an embodiment, the adhesive layer 24 has a thickness of 100 μm to 300 μm. In an embodiment, the adhesive layer 24 has a thickness of 100 μm to 250 μm.

In an embodiment, the adhesive layer 24 has a thickness of 100 μm to 200 μm. In an embodiment, the adhesive layer 24 has a thickness of 100 μm to 150 μm.

In an embodiment, the adhesive layer 24 has a thickness of 150 μm to 900 μm. In an embodiment, the adhesive layer 24 has a thickness of 150 μm to 850 μm. In an embodiment, the adhesive layer 24 has a thickness of 150 μm to 800 μm. In an embodiment, the adhesive layer 24 has a thickness of 150 μm to 750 μm. In an embodiment, the adhesive layer 24 has a thickness of 150 μm to 700 μm. In an embodiment, the adhesive layer 24 has a thickness of 150 μm to 650 μm. In an embodiment, the adhesive layer 24 has a thickness of 150 μm to 600 μm. In an embodiment, the adhesive layer 24 has a thickness of 150 μm to 550 μm. In an embodiment, the adhesive layer 24 has a thickness of 150 μm to 500 μm. In an embodiment, the adhesive layer 24 has a thickness of 150 μm to 450 μm. In an embodiment, the adhesive layer 24 has a thickness of 150 μm to 400 μm. In an embodiment, the adhesive layer 24 has a thickness of 150 μm to 350 μm. In an embodiment, the adhesive layer 24 has a thickness of 150 μm to 300 μm. In an embodiment, the adhesive layer 24 has a thickness of 150 μm to 250 μm. In an embodiment, the adhesive layer 24 has a thickness of 150 μm to 200 μm.

In an embodiment, the adhesive layer 24 has a thickness of 200 μm to 900 μm. In an embodiment, the adhesive layer 24 has a thickness of 200 μm to 850 μm. In an embodiment, the adhesive layer 24 has a thickness of 200 μm to 800 μm. In an embodiment, the adhesive layer 24 has a thickness of 200 μm to 750 μm. In an embodiment, the adhesive layer 24 has a thickness of 200 µm to 700 µm. In an embodiment, the adhesive layer 24 has a thickness of 200 µm to 650 µm. In an embodiment, the adhesive layer 24 has a thickness of 200 µm to 600 µm. In an embodiment, the adhesive layer 24 has a thickness of 200 µm to 550 µm. In an embodiment, the adhesive layer 24 has a thickness of 200 µm to 500 µm. In an embodiment, the adhesive layer 24 has a thickness of 200 µm to 450 µm. In an embodiment, the adhesive layer 24 has a thickness of 200 µm to 400 µm. In an embodiment, the adhesive layer 24 has a thickness of 200 µm to 350 µm. In an embodiment, the adhesive layer 24 has a thickness of 200 µm to 300 µm. In an embodiment, the adhesive layer 24 has a thickness of 200 µm to 250 µm.

In an embodiment, the adhesive layer 24 has a thickness of 250 µm to 900 µm. In an embodiment, the adhesive layer 24 has a thickness of 250 µm to 850 µm. In an embodiment, the adhesive layer 24 has a thickness of 250 µm to 800 µm. In an embodiment, the adhesive layer 24 has a thickness of 250 µm to 750 µm. In an embodiment, the adhesive layer 24 has a thickness of 250 µm to 700 µm. In an embodiment, the adhesive layer 24 has a thickness of 250 µm to 650 µm. In an embodiment, the adhesive layer 24 has a thickness of 250 µm to 600 µm. In an embodiment, the adhesive layer 24 has a thickness of 250 µm to 550 µm. In an embodiment, the adhesive layer 24 has a thickness of 250 µm to 500 µm. In an embodiment, the adhesive layer 24 has a thickness of 250 µm to 450 µm. In an embodiment, the adhesive layer 24 has a thickness of 250 µm to 400 µm. In an embodiment, the adhesive layer 24 has a thickness of 250 µm to 350 µm. In an embodiment, the adhesive layer 24 has a thickness of 250 µm to 300 µm.

In an embodiment, the adhesive layer 24 has a thickness of 300 µm to 900 µm. In an embodiment, the adhesive layer 24 has a thickness of 300 µm to 850 µm. In an embodiment, the adhesive layer 24 has a thickness of 300 µm to 800 µm. In an embodiment, the adhesive layer 24 has a thickness of 300 µm to 750 µm. In an embodiment, the adhesive layer 24 has a thickness of 300 µm to 700 µm. In an embodiment, the adhesive layer 24 has a thickness of 300 µm to 650 µm. In an embodiment, the adhesive layer 24 has a thickness of 300 µm to 600 µm. In an embodiment, the adhesive layer 24 has a thickness of 300 µm to 550 µm. In an embodiment, the adhesive layer 24 has a thickness of 300 µm to 500 µm. In an embodiment, the adhesive layer 24 has a thickness of 300 µm to 450 µm. In an embodiment, the adhesive layer 24 has a thickness of 300 µm to 400 µm. In an embodiment, the adhesive layer 24 has a thickness of 300 µm to 350 µm.

In an embodiment, the adhesive layer 24 has a thickness of 350 µm to 900 µm. In an embodiment, the adhesive layer 24 has a thickness of 350 µm to 850 µm. In an embodiment, the adhesive layer 24 has a thickness of 350 µm to 800 µm. In an embodiment, the adhesive layer 24 has a thickness of 350 µm to 750 µm. In an embodiment, the adhesive layer 24 has a thickness of 350 µm to 700 µm. In an embodiment, the adhesive layer 24 has a thickness of 350 µm to 650 µm. In an embodiment, the adhesive layer 24 has a thickness of 350 µm to 600 µm. In an embodiment, the adhesive layer 24 has a thickness of 350 µm to 550 µm. In an embodiment, the adhesive layer 24 has a thickness of 350 µm to 500 µm. In an embodiment, the adhesive layer 24 has a thickness of 350 µm to 450 µm. In an embodiment, the adhesive layer 24 has a thickness of 350 µm to 400 µm.

In an embodiment, the adhesive layer 24 has a thickness of 400 µm to 900 µm. In an embodiment, the adhesive layer 24 has a thickness of 400 µm to 850 µm. In an embodiment, the adhesive layer 24 has a thickness of 400 µm to 800 µm. In an embodiment, the adhesive layer 24 has a thickness of 400 µm to 750 µm. In an embodiment, the adhesive layer 24 has a thickness of 400 µm to 700 µm. In an embodiment, the adhesive layer 24 has a thickness of 400 µm to 650 µm. In an embodiment, the adhesive layer 24 has a thickness of 400 µm to 600 µm. In an embodiment, the adhesive layer 24 has a thickness of 400 µm to 550 µm. In an embodiment, the adhesive layer 24 has a thickness of 400 µm to 500 µm. In an embodiment, the adhesive layer 24 has a thickness of 400 µm to 450 µm.

In an embodiment, the adhesive layer 24 has a thickness of 450 µm to 900 µm. In an embodiment, the adhesive layer 24 has a thickness of 450 µm to 850 µm. In an embodiment, the adhesive layer 24 has a thickness of 450 µm to 800 µm. In an embodiment, the adhesive layer 24 has a thickness of 450 µm to 750 µm. In an embodiment, the adhesive layer 24 has a thickness of 450 µm to 700 µm. In an embodiment, the adhesive layer 24 has a thickness of 450 µm to 650 µm. In an embodiment, the adhesive layer 24 has a thickness of 450 µm to 600 µm. In an embodiment, the adhesive layer 24 has a thickness of 450 µm to 550 µm. In an embodiment, the adhesive layer 24 has a thickness of 450 µm to 500 µm.

In an embodiment, the adhesive layer 24 has a thickness of 500 µm to 900 µm. In an embodiment, the adhesive layer 24 has a thickness of 500 µm to 850 µm. In an embodiment, the adhesive layer 24 has a thickness of 500 µm to 800 µm. In an embodiment, the adhesive layer 24 has a thickness of 500 µm to 750 µm. In an embodiment, the adhesive layer 24 has a thickness of 500 µm to 700 µm. In an embodiment, the adhesive layer 24 has a thickness of 500 µm to 650 µm. In an embodiment, the adhesive layer 24 has a thickness of 500 µm to 600 µm. In an embodiment, the adhesive layer 24 has a thickness of 500 µm to 550 µm.

In an embodiment, the adhesive layer 24 has a thickness of 550 µm to 900 µm. In an embodiment, the adhesive layer 24 has a thickness of 550 µm to 850 µm. In an embodiment, the adhesive layer 24 has a thickness of 550 µm to 800 µm. In an embodiment, the adhesive layer 24 has a thickness of 550 µm to 750 µm. In an embodiment, the adhesive layer 24 has a thickness of 550 µm to 700 µm. In an embodiment, the adhesive layer 24 has a thickness of 550 µm to 650 µm. In an embodiment, the adhesive layer 24 has a thickness of 550 µm to 600 µm.

In an embodiment, the adhesive layer 24 has a thickness of 600 µm to 900 µm. In an embodiment, the adhesive layer 24 has a thickness of 600 µm to 850 µm. In an embodiment, the adhesive layer 24 has a thickness of 600 µm to 800 µm. In an embodiment, the adhesive layer 24 has a thickness of 600 µm to 750 µm. In an embodiment, the adhesive layer 24 has a thickness of 600 µm to 700 µm. In an embodiment, the adhesive layer 24 has a thickness of 600 µm to 650 µm.

In an embodiment, the adhesive layer 24 has a thickness of 650 µm to 900 µm. In an embodiment, the adhesive layer 24 has a thickness of 650 µm to 850 µm. In an embodiment, the adhesive layer 24 has a thickness of 650 µm to 800 µm. In an embodiment, the adhesive layer 24 has a thickness of 650 µm to 750 µm. In an embodiment, the adhesive layer 24 has a thickness of 650 µm to 700 µm. In an embodiment, the adhesive layer 24 has a thickness of 700 µm to 900 µm. In an embodiment, the adhesive layer 24 has a thickness of 700 µm to 850 µm. In an embodiment, the adhesive layer 24 has a thickness of 700 µm to 800 µm. In an embodiment, the adhesive layer 24 has a thickness of 700 µm to 750 µm. In an embodiment, the adhesive layer 24 has a thickness of 750 µm to 900 µm. In an embodiment, the adhesive layer 24 has a thickness of 750 µm to 850 µm. In an embodiment, the adhesive layer 24 has a thickness of 750 µm to 800 µm. In an embodiment, the adhesive layer 24 has a thickness of 800

μm to 900 μm. In an embodiment, the adhesive layer 24 has a thickness of 800 μm to 850 μm. In an embodiment, the adhesive layer 24 has a thickness of 850 μm to 900 μm.

In an embodiment, the adhesive layer 24 has a thickness of 1 μm. In an embodiment, the adhesive layer 24 has a thickness of 50 μm. In an embodiment, the adhesive layer 24 has a thickness of 100 μm. In an embodiment, the adhesive layer 24 has a thickness of 1 μm. In an embodiment, the adhesive layer 24 has a thickness of 150 μm. In an embodiment, the adhesive layer 24 has a thickness of 200 μm. In an embodiment, the adhesive layer 24 has a thickness of 250 μm. In an embodiment, the adhesive layer 24 has a thickness of 300 μm. In an embodiment, the adhesive layer 24 has a thickness of 350 μm. In an embodiment, the adhesive layer 24 has a thickness of 400 μm. In an embodiment, the adhesive layer 24 has a thickness of 450 μm. In an embodiment, the adhesive layer 24 has a thickness of 500 μm. In an embodiment, the adhesive layer 24 has a thickness of 550 μm. In an embodiment, the adhesive layer 24 has a thickness of 600 μm. In an embodiment, the adhesive layer 24 has a thickness of 650 μm. In an embodiment, the adhesive layer 24 has a thickness of 700 μm. In an embodiment, the adhesive layer 24 has a thickness of 750 μm. In an embodiment, the adhesive layer 24 has a thickness of 800 μm. In an embodiment, the adhesive layer 24 has a thickness of 850 μm. In an embodiment, the adhesive layer 24 has a thickness of 900 μm.

In an embodiment, the polymer layer 22 includes a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In an embodiment, the frontsheet includes fluoropolymers, acrylics, polyesters, silicones, polycarbonates, or combinations thereof. In other embodiments, the polymer layer 22 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In an embodiment, the polymer layer 22 includes a crosslinked polymeric material. In an embodiment, 50% to 99% of the polymer chains of the polymeric material are crosslinked.

In an embodiment, the polymer layer 22 has a thickness of 0.01 mm to 0.5 mm. In another embodiment, the polymer layer 22 has a thickness of 0.01 mm to 0.4 mm. In another embodiment, the polymer layer 22 has a thickness of 0.01 mm to 0.3 mm. In another embodiment, the polymer layer 22 has a thickness of 0.01 mm to 0.2 mm. In another embodiment, the polymer layer 22 has a thickness of 0.01 mm to 0.1 mm. In another embodiment, the polymer layer 22 has a thickness of 0.01 mm to 0.09 mm. In another embodiment, the polymer layer 22 has a thickness of 0.01 mm to 0.08 mm. In another embodiment, the polymer layer 22 has a thickness of 0.01 mm to 0.07 mm. In another embodiment, the polymer layer 22 has a thickness of 0.01 mm to 0.06 mm. In another embodiment, the polymer layer 22 has a thickness of 0.01 mm to 0.05 mm. In another embodiment, the polymer layer 22 has a thickness of 0.01 mm to 0.04 mm. In another embodiment, the polymer layer 22 has a thickness of 0.01 mm to 0.03 mm. In another embodiment, the polymer layer 22 has a thickness of 0.01 mm to 0.02 mm.

In another embodiment, the polymer layer 22 has a thickness of 0.01 mm to 0.4 mm. In another embodiment, the polymer layer 22 has a thickness of 0.02 mm to 0.4 mm. In another embodiment, the polymer layer 22 has a thickness of 0.03 mm to 0.4 mm. In another embodiment, the polymer layer 22 has a thickness of 0.04 mm to 0.4 mm. In another embodiment, the polymer layer 22 has a thickness of 0.05 mm to 0.4 mm. In another embodiment, the polymer layer 22 has a thickness of 0.06 mm to 0.4 mm. In another embodiment, the polymer layer 22 has a thickness of 0.07 mm to 0.4 mm. In another embodiment, the polymer layer 22 has a thickness of 0.08 mm to 0.4 mm. In another embodiment, the polymer layer 22 has a thickness of 0.09 mm to 0.4 mm. In another embodiment, the polymer layer 22 has a thickness of 0.1 mm to 0.4 mm. In another embodiment, the polymer layer 22 has a thickness of 0.15 mm to 0.4 mm. In another embodiment, the polymer layer 22 has a thickness of 0.2 mm to 0.4 mm. In another embodiment, the polymer layer 22 has a thickness of 0.25 mm to 0.4 mm. In another embodiment, the polymer layer 22 has a thickness of 0.3 mm to 0.4 mm. In another embodiment, the polymer layer 22 has a thickness of 0.35 mm to 0.4 mm.

In another embodiment, the polymer layer 22 has a thickness of 0.025 mm to 0.1 mm. In another embodiment, the polymer layer 22 has a thickness of 0.03 mm to 0.1 mm. In another embodiment, the polymer layer 22 has a thickness of 0.035 mm to 0.1 mm. In another embodiment, the polymer layer 22 has a thickness of 0.04 mm to 0.1 mm. In another embodiment, the polymer layer 22 has a thickness of 0.045 mm to 0.1 mm. In another embodiment, the polymer layer 22 has a thickness of 0.05 mm to 0.1 mm. In another embodiment, the polymer layer 22 has a thickness of 0.06 mm to 0.1 mm. In another embodiment, the polymer layer 22 has a thickness of 0.065 mm to 0.1 mm. In another embodiment, the polymer layer 22 has a thickness of 0.07 mm to 0.1 mm. In another embodiment, the polymer layer 22 has a thickness of 0.075 mm to 0.1 mm. In another embodiment, the polymer layer 22 has a thickness of 0.08 mm to 0.1 mm. In another embodiment, the polymer layer 22 has a thickness of 0.085 mm to 0.1 mm. In another embodiment, the polymer layer 22 has a thickness of 0.09 mm to 0.1 mm. In another embodiment, the polymer layer 22 has a thickness of 0.095 mm to 0.1 mm.

In an embodiment, the light scattering encapsulant layer 20 has a thickness of 1 μm to 900 μm. In an embodiment, the light scattering encapsulant layer 20 has a thickness of 1 μm to 900 μm. In an embodiment, the light scattering encapsulant layer 20 has a thickness of 1 μm to 850 μm. In an embodiment, the light scattering encapsulant layer 20 has a thickness of 1 μm to 800 μm. In an embodiment, the light scattering encapsulant layer 20 has a thickness of 1 μm to 750 μm. In an embodiment, the light scattering encapsulant layer 20 has a thickness of 1 μm to 700 μm. In an embodiment, the light scattering encapsulant layer 20 has a thickness of 1 μm to 650 μm. In an embodiment, the light scattering encapsulant layer 20 has a thickness of 1 μm to 600 μm. In an embodiment, the light scattering encapsulant layer 20 has a thickness of 1 μm to 550 μm. In an embodiment, the light scattering encapsulant layer 20 has a thickness of 1 μm to 500 μm. In an embodiment, the light scattering encapsulant layer 20 has a thickness of 1 μm to 450 μm. In an embodiment, the light scattering encapsulant layer 20 has a thickness of 1 μm to 400 μm. In an embodiment, the light scattering encapsulant layer 20 has a thickness of 1 μm to 350 μm. In an embodiment, the light scattering encapsulant layer 20 has a thickness of 1 μm to 300 µm. In an embodiment, the light scattering encapsulant layer 20 has a thickness of 1 µm to 250 µm. In an embodiment, the light scattering encapsulant layer 20 has a thickness of 1 µm to 200 µm. In an embodiment, the light scattering encapsulant layer 20 has a thickness of 1 µm to 150 µm. In an embodiment, the light scattering encapsulant layer 20 has a thickness of 1 µm to 100 µm. In an embodiment, the light scattering encapsulant layer 20 has a thickness of 1 µm to 50 µm.

In an embodiment, the light scattering encapsulant layer 20 has a thickness of 50 µm to 900 µm. In an embodiment, the light scattering encapsulant layer 20 has a thickness of 50 µm to 850 µm. In an embodiment, the light scattering encapsulant layer 20 has a thickness of 50 µm to 800 µm. In an embodiment, the light scattering encapsulant layer 20 has a thickness of 50 µm to 750 µm. In an embodiment, the light scattering encapsulant layer 20 has a thickness of 50 µm to 700 µm. In an embodiment, the light scattering encapsulant layer 20 has a thickness of 50 µm to 650 µm. In an embodiment, the light scattering encapsulant layer 20 has a thickness of 50 µm to 600 µm. In an embodiment, the light scattering encapsulant layer 20 has a thickness of 50 µm to 550 µm. In an embodiment, the light scattering encapsulant layer 20 has a thickness of 50 µm to 500 µm. In an embodiment, the light scattering encapsulant layer 20 has a thickness of 50 µm to 450 µm. In an embodiment, the light scattering encapsulant layer 20 has a thickness of 50 µm to 400 µm. In an embodiment, the light scattering encapsulant layer 20 has a thickness of 50 µm to 350 µm. In an embodiment, the light scattering encapsulant layer 20 has a thickness of 50 µm to 300 µm. In an embodiment, the light scattering encapsulant layer 20 has a thickness of 50 µm to 250 µm. In an embodiment, the light scattering encapsulant layer 20 has a thickness of 50 µm to 200 µm. In an embodiment, the light scattering encapsulant layer 20 has a thickness of 50 µm to 150 µm. In an embodiment, the light scattering encapsulant layer 20 has a thickness of 50 µm to 100 µm.

In an embodiment, the light scattering encapsulant layer 20 has a thickness of 100 µm to 900 µm. In an embodiment, the light scattering encapsulant layer 20 has a thickness of 100 µm to 850 µm. In an embodiment, the light scattering encapsulant layer 20 has a thickness of 100 µm to 800 µm. In an embodiment, the light scattering encapsulant layer 20 has a thickness of 100 µm to 750 µm. In an embodiment, the light scattering encapsulant layer 20 has a thickness of 100 µm to 700 µm. In an embodiment, the light scattering encapsulant layer 20 has a thickness of 100 µm to 650 µm. In an embodiment, the light scattering encapsulant layer 20 has a thickness of 100 µm to 600 µm. In an embodiment, the light scattering encapsulant layer 20 has a thickness of 100 µm to 550 µm. In an embodiment, the light scattering encapsulant layer 20 has a thickness of 100 µm to 500 µm. In an embodiment, the light scattering encapsulant layer 20 has a thickness of 100 µm to 450 µm. In an embodiment, the light scattering encapsulant layer 20 has a thickness of 100 µm to 400 µm. In an embodiment, the light scattering encapsulant layer 20 has a thickness of 100 µm to 350 µm. In an embodiment, the light scattering encapsulant layer 20 has a thickness of 100 µm to 300 µm. In an embodiment, the light scattering encapsulant layer 20 has a thickness of 100 µm to 250 µm. In an embodiment, the light scattering encapsulant layer 20 has a thickness of 100 µm to 200 µm. In an embodiment, the light scattering encapsulant layer 20 has a thickness of 100 µm to 150 µm.

In an embodiment, the light scattering encapsulant layer 20 has a thickness of 150 µm to 900 µm. In an embodiment, the light scattering encapsulant layer 20 has a thickness of 150 µm to 850 µm. In an embodiment, the light scattering encapsulant layer 20 has a thickness of 150 µm to 800 µm. In an embodiment, the light scattering encapsulant layer 20 has a thickness of 150 µm to 750 µm. In an embodiment, the light scattering encapsulant layer 20 has a thickness of 150 µm to 700 µm. In an embodiment, the light scattering encapsulant layer 20 has a thickness of 150 µm to 650 µm. In an embodiment, the light scattering encapsulant layer 20 has a thickness of 150 µm to 600 µm. In an embodiment, the light scattering encapsulant layer 20 has a thickness of 150 µm to 550 µm. In an embodiment, the light scattering encapsulant layer 20 has a thickness of 150 µm to 500 µm. In an embodiment, the light scattering encapsulant layer 20 has a thickness of 150 µm to 450 µm. In an embodiment, the light scattering encapsulant layer 20 has a thickness of 150 µm to 400 µm. In an embodiment, the light scattering encapsulant layer 20 has a thickness of 150 µm to 350 µm. In an embodiment, the light scattering encapsulant layer 20 has a thickness of 150 µm to 300 µm. In an embodiment, the light scattering encapsulant layer 20 has a thickness of 150 µm to 250 µm. In an embodiment, the light scattering encapsulant layer 20 has a thickness of 150 µm to 200 µm.

In an embodiment, the light scattering encapsulant layer 20 has a thickness of 200 µm to 900 µm. In an embodiment, the light scattering encapsulant layer 20 has a thickness of 200 µm to 850 µm. In an embodiment, the light scattering encapsulant layer 20 has a thickness of 200 µm to 800 µm. In an embodiment, the light scattering encapsulant layer 20 has a thickness of 200 µm to 750 µm. In an embodiment, the light scattering encapsulant layer 20 has a thickness of 200 µm to 700 µm. In an embodiment, the light scattering encapsulant layer 20 has a thickness of 200 µm to 650 µm. In an embodiment, the light scattering encapsulant layer 20 has a thickness of 200 µm to 600 µm. In an embodiment, the light scattering encapsulant layer 20 has a thickness of 200 µm to 550 µm. In an embodiment, the light scattering encapsulant layer 20 has a thickness of 200 µm to 500 µm. In an embodiment, the light scattering encapsulant layer 20 has a thickness of 200 µm to 450 µm. In an embodiment, the light scattering encapsulant layer 20 has a thickness of 200 µm to 400 µm. In an embodiment, the light scattering encapsulant layer 20 has a thickness of 200 µm to 350 µm. In an embodiment, the light scattering encapsulant layer 20 has a thickness of 200 µm to 300 µm. In an embodiment, the light scattering encapsulant layer 20 has a thickness of 200 µm to 250 µm.

In an embodiment, the light scattering encapsulant layer 20 has a thickness of 250 µm to 900 µm. In an embodiment, the light scattering encapsulant layer 20 has a thickness of 250 µm to 850 µm. In an embodiment, the light scattering encapsulant layer 20 has a thickness of 250 µm to 800 µm. In an embodiment, the light scattering encapsulant layer 20 has a thickness of 250 µm to 750 µm. In an embodiment, the light scattering encapsulant layer 20 has a thickness of 250 µm to 700 µm. In an embodiment, the light scattering encapsulant layer 20 has a thickness of 250 µm to 650 µm. In an embodiment, the light scattering encapsulant layer 20 has a thickness of 250 µm to 600 µm. In an embodiment, the light scattering encapsulant layer 20 has a thickness of 250 µm to 550 µm. In an embodiment, the light scattering encapsulant layer 20 has a thickness of 250 µm to 500 µm. In an embodiment, the light scattering encapsulant layer 20 has a thickness of 250 µm to 450 µm. In an embodiment, the light scattering encapsulant layer 20 has a thickness of 250 µm to 400 µm. In an embodiment, the light scattering encapsulant layer 20 has a thickness of 250 µm to 350 µm.

In an embodiment, the light scattering encapsulant layer 20 has a thickness of 250 µm to 300 µm.

In an embodiment, the light scattering encapsulant layer 20 has a thickness of 300 µm to 900 µm. In an embodiment, the light scattering encapsulant layer 20 has a thickness of 300 µm to 850 µm. In an embodiment, the light scattering encapsulant layer 20 has a thickness of 300 µm to 800 µm. In an embodiment, the light scattering encapsulant layer 20 has a thickness of 300 µm to 750 µm. In an embodiment, the light scattering encapsulant layer 20 has a thickness of 300 µm to 700 µm. In an embodiment, the light scattering encapsulant layer 20 has a thickness of 300 µm to 650 µm. In an embodiment, the light scattering encapsulant layer 20 has a thickness of 300 µm to 600 µm. In an embodiment, the light scattering encapsulant layer 20 has a thickness of 300 µm to 550 µm. In an embodiment, the light scattering encapsulant layer 20 has a thickness of 300 µm to 500 µm. In an embodiment, the light scattering encapsulant layer 20 has a thickness of 300 µm to 450 µm. In an embodiment, the light scattering encapsulant layer 20 has a thickness of 300 µm to 400 µm. In an embodiment, the light scattering encapsulant layer 20 has a thickness of 300 µm to 350 µm.

In an embodiment, the light scattering encapsulant layer 20 has a thickness of 350 µm to 900 µm. In an embodiment, the light scattering encapsulant layer 20 has a thickness of 350 µm to 850 µm. In an embodiment, the light scattering encapsulant layer 20 has a thickness of 350 µm to 800 µm. In an embodiment, the light scattering encapsulant layer 20 has a thickness of 350 µm to 750 µm. In an embodiment, the light scattering encapsulant layer 20 has a thickness of 350 µm to 700 µm. In an embodiment, the light scattering encapsulant layer 20 has a thickness of 350 µm to 650 µm. In an embodiment, the light scattering encapsulant layer 20 has a thickness of 350 µm to 600 µm. In an embodiment, the light scattering encapsulant layer 20 has a thickness of 350 µm to 550 µm. In an embodiment, the light scattering encapsulant layer 20 has a thickness of 350 µm to 500 µm. In an embodiment, the light scattering encapsulant layer 20 has a thickness of 350 µm to 450 µm. In an embodiment, the light scattering encapsulant layer 20 has a thickness of 350 µm to 400 µm.

In an embodiment, the light scattering encapsulant layer 20 has a thickness of 400 µm to 900 µm. In an embodiment, the light scattering encapsulant layer 20 has a thickness of 400 µm to 850 µm. In an embodiment, the light scattering encapsulant layer 20 has a thickness of 400 µm to 800 µm. In an embodiment, the light scattering encapsulant layer 20 has a thickness of 400 µm to 750 µm. In an embodiment, the light scattering encapsulant layer 20 has a thickness of 400 µm to 700 µm. In an embodiment, the light scattering encapsulant layer 20 has a thickness of 400 µm to 650 µm. In an embodiment, the light scattering encapsulant layer 20 has a thickness of 400 µm to 600 µm. In an embodiment, the light scattering encapsulant layer 20 has a thickness of 400 µm to 550 µm. In an embodiment, the light scattering encapsulant layer 20 has a thickness of 400 µm to 500 µm. In an embodiment, the light scattering encapsulant layer 20 has a thickness of 400 µm to 450 µm.

In an embodiment, the light scattering encapsulant layer 20 has a thickness of 450 µm to 900 µm. In an embodiment, the light scattering encapsulant layer 20 has a thickness of 450 µm to 850 µm. In an embodiment, the light scattering encapsulant layer 20 has a thickness of 450 µm to 800 µm. In an embodiment, the light scattering encapsulant layer 20 has a thickness of 450 µm to 750 µm. In an embodiment, the light scattering encapsulant layer 20 has a thickness of 450 µm to 700 µm. In an embodiment, the light scattering encapsulant layer 20 has a thickness of 450 µm to 650 µm. In an embodiment, the light scattering encapsulant layer 20 has a thickness of 450 µm to 600 µm. In an embodiment, the light scattering encapsulant layer 20 has a thickness of 450 µm to 550 µm. In an embodiment, the light scattering encapsulant layer 20 has a thickness of 450 µm to 500 µm.

In an embodiment, the light scattering encapsulant layer 20 has a thickness of 500 µm to 900 µm. In an embodiment, the light scattering encapsulant layer 20 has a thickness of 500 µm to 850 µm. In an embodiment, the light scattering encapsulant layer 20 has a thickness of 500 µm to 800 µm. In an embodiment, the light scattering encapsulant layer 20 has a thickness of 500 µm to 750 µm. In an embodiment, the light scattering encapsulant layer 20 has a thickness of 500 µm to 700 µm. In an embodiment, the light scattering encapsulant layer 20 has a thickness of 500 µm to 650 µm. In an embodiment, the light scattering encapsulant layer 20 has a thickness of 500 µm to 600 µm. In an embodiment, the light scattering encapsulant layer 20 has a thickness of 500 µm to 550 µm.

In an embodiment, the light scattering encapsulant layer 20 has a thickness of 550 µm to 900 µm. In an embodiment, the light scattering encapsulant layer 20 has a thickness of 550 µm to 850 µm. In an embodiment, the light scattering encapsulant layer 20 has a thickness of 550 µm to 800 µm. In an embodiment, the light scattering encapsulant layer 20 has a thickness of 550 µm to 750 µm. In an embodiment, the light scattering encapsulant layer 20 has a thickness of 550 µm to 700 µm. In an embodiment, the light scattering encapsulant layer 20 has a thickness of 550 µm to 650 µm. In an embodiment, the light scattering encapsulant layer 20 has a thickness of 550 µm to 600 µm.

In an embodiment, the light scattering encapsulant layer 20 has a thickness of 600 µm to 900 µm. In an embodiment, the light scattering encapsulant layer 20 has a thickness of 600 µm to 850 µm. In an embodiment, the light scattering encapsulant layer 20 has a thickness of 600 µm to 800 µm. In an embodiment, the light scattering encapsulant layer 20 has a thickness of 600 µm to 750 µm. In an embodiment, the light scattering encapsulant layer 20 has a thickness of 600 µm to 700 µm. In an embodiment, the light scattering encapsulant layer 20 has a thickness of 600 µm to 650 µm.

In an embodiment, the light scattering encapsulant layer 20 has a thickness of 650 µm to 900 µm. In an embodiment, the light scattering encapsulant layer 20 has a thickness of 650 µm to 850 µm. In an embodiment, the light scattering encapsulant layer 20 has a thickness of 650 µm to 800 µm. In an embodiment, the light scattering encapsulant layer 20 has a thickness of 650 µm to 750 µm. In an embodiment, the light scattering encapsulant layer 20 has a thickness of 650 µm to 700 µm. In an embodiment, the light scattering encapsulant layer 20 has a thickness of 700 µm to 900 µm. In an embodiment, the light scattering encapsulant layer 20 has a thickness of 700 µm to 850 µm. In an embodiment, the light scattering encapsulant layer 20 has a thickness of 700 µm to 800 µm. In an embodiment, the light scattering encapsulant layer 20 has a thickness of 700 µm to 750 µm. In an embodiment, the light scattering encapsulant layer 20 has a thickness of 750 µm to 900 µm. In an embodiment, the light scattering encapsulant layer 20 has a thickness of 750 µm to 850 µm. In an embodiment, the light scattering encapsulant layer 20 has a thickness of 750 µm to 800 µm. In an embodiment, the light scattering encapsulant layer 20 has a thickness of 800 µm to 900 µm. In an embodiment, the light scattering encapsulant layer 20 has a thickness of 800 µm to 850 µm. In an embodiment, the light scattering encapsulant layer 20 has a thickness of 850 µm to 900 µm.

In an embodiment, the light scattering encapsulant layer 20 has a thickness of 1 µm. In an embodiment, the light scattering encapsulant layer 20 has a thickness of 50 µm. In an embodiment, the light scattering encapsulant layer 20 has a thickness of 100 µm. In an embodiment, the light scattering encapsulant layer 20 has a thickness of 1 µm. In an embodiment, the light scattering encapsulant layer 20 has a thickness of 150 µm. In an embodiment, the light scattering encapsulant layer 20 has a thickness of 200 µm. In an embodiment, the light scattering encapsulant layer 20 has a thickness of 250 µm. In an embodiment, the light scattering encapsulant layer 20 has a thickness of 300 µm. In an embodiment, the light scattering encapsulant layer 20 has a thickness of 350 µm. In an embodiment, the light scattering encapsulant layer 20 has a thickness of 400 µm. In an embodiment, the light scattering encapsulant layer 20 has a thickness of 450 µm. In an embodiment, the light scattering encapsulant layer 20 has a thickness of 500 µm. In an embodiment, the light scattering encapsulant layer 20 has a thickness of 550 µm. In an embodiment, the light scattering encapsulant layer 20 has a thickness of 600 µm. In an embodiment, the light scattering encapsulant layer 20 has a thickness of 650 µm. In an embodiment, the light scattering encapsulant layer 20 has a thickness of 700 µm. In an embodiment, the light scattering encapsulant layer 20 has a thickness of 750 µm. In an embodiment, the light scattering encapsulant layer 20 has a thickness of 800 µm. In an embodiment, the light scattering encapsulant layer 20 has a thickness of 850 µm. In an embodiment, the light scattering encapsulant layer 20 has a thickness of 900 µm.

In some embodiments, the light scattering encapsulant layer 20 includes a first region 26 and a second region 28 including a plurality of portions 30. In an embodiment, the second region 28 includes at least one area 32 separating adjacent ones of the portions 30, such that no material (e.g., material of the first region 26) is present within the at least one area 32. In an embodiment, the at least one area 32 includes a plurality of the areas 32. In some embodiments, intermittent ones of the portions 30 and the areas 32 form an arrangement that can be referred to as a "dragontooth" arrangement. In some embodiments, each of the portions 30 have different shapes and sizes. In an embodiment, each of the portions 30 have identical shapes and sizes. In some embodiments, each of the areas 32 have different shapes and sizes. In an embodiment, each of the areas 32 have identical shapes and sizes.

In some embodiments, variations in the light scattering properties of the portions 30 of the light scattering encapsulant layer 20 are achieved by placing pieces of light-scattering materials (e.g., portions of the encapsulant material of the light scattering encapsulant layer 20 that have different light-scattering properties) within the light scattering encapsulant layer 20 before the lamination process. In some embodiments, the light scattering encapsulant layer 20 includes at least two of the portions 30 having different light scattering properties from one another. In some embodiments, a light scattering value of each of the portions 30 can be quantified in accordance with the ASTM D1003 Standard Test Method for Haze and Luminous Transmittance of Transparent Plastics. In some embodiments, a light scattering value of each such portion 30 can be quantified in accordance with the ASTM E430 Standard Test Methods for Measurement of Gloss of High-Gloss Surfaces by Abridged Goniophotometry. In some embodiments, a light scattering value of each such portion 30 can be quantified in accordance with ISO 13803 standard-Paints and Varnishes—Determination of Haze on Paint Films at 20°. In an embodiment, the light scattering value of a first one of the portions 30 of the light scattering encapsulant layer 20 is greater than the light scattering value of a second one of the portions 30 of the light scattering encapsulant layer 20. In another embodiment, the light scattering value of a first one of the portions 30 of the light scattering encapsulant layer 20 is equal to the light scattering value of a second one of the portions 30 of the light scattering encapsulant layer 20. In an embodiment, the light scattering value of the first one of the portions 30 and the light scattering value of the second one of the portions 30 of the light scattering encapsulant layer 20 are measured in haze units (HU).

In an embodiment, the light scattering value of the first one of the portions 30 of the light scattering encapsulant layer 20 is 0.1 HU to 12 HU. In an embodiment, the light scattering value of the first one of the portions 30 of the light scattering encapsulant layer 20 is 0.1 HU to 11 HU. In an embodiment, the light scattering value of the first one of the portions 30 of the light scattering encapsulant layer 20 is 0.1 HU to 10 HU. In an embodiment, the light scattering value of the first one of the portions 30 of the light scattering encapsulant layer 20 is 0.1 HU to 9 HU. In an embodiment, the light scattering value of the first one of the portions 30 of the light scattering encapsulant layer 20 is 0.1 HU to 8 HU. In an embodiment, the light scattering value of the first one of the portions 30 of the light scattering encapsulant layer 20 is 0.1 HU to 7 HU. In an embodiment, the light scattering value of the first one of the portions 30 of the light scattering encapsulant layer 20 is 0.1 HU to 6 HU. In an embodiment, the light scattering value of the first one of the portions 30 of the light scattering encapsulant layer 20 is 0.1 HU to 5 HU. In an embodiment, the light scattering value of the first one of the portions 30 of the light scattering encapsulant layer 20 is 0.1 HU to 4 HU. In an embodiment, the light scattering value of the first one of the portions 30 of the light scattering encapsulant layer 20 is 0.1 HU to 3 HU. In an embodiment, the light scattering value of the first one of the portions 30 of the light scattering encapsulant layer 20 is 0.1 HU to 2 HU. In an embodiment, the light scattering value of the first one of the portions 30 of the light scattering encapsulant layer 20 is 0.1 HU to 1 HU. In an embodiment, the light scattering value of the first one of the portions 30 of the light scattering encapsulant layer 20 is 0.1 HU to 0.5 HU.

In an embodiment, the light scattering value of the first one of the portions 30 of the light scattering encapsulant layer 20 is 0.5 HU to 12 HU. In an embodiment, the light scattering value of the first one of the portions 30 of the light scattering encapsulant layer 20 is 0.5 HU to 11 HU. In an embodiment, the light scattering value of the first one of the portions 30 of the light scattering encapsulant layer 20 is 0.5 HU to 10 HU. In an embodiment, the light scattering value of the first one of the portions 30 of the light scattering encapsulant layer 20 is 0.5 HU to 9 HU. In an embodiment, the light scattering value of the first one of the portions 30 of the light scattering encapsulant layer 20 is 0.5 HU to 8 HU. In an embodiment, the light scattering value of the first one of the portions 30 of the light scattering encapsulant layer 20 is 0.5 HU to 7 HU. In an embodiment, the light scattering value of the first one of the portions 30 of the light scattering encapsulant layer 20 is 0.5 HU to 6 HU. In an embodiment, the light scattering value of the first one of the portions 30 of the light scattering encapsulant layer 20 is 0.5 HU to 5 HU. In an embodiment, the light scattering value of the first one of the portions 30 of the light scattering encapsulant layer 20 is 0.5 HU to 4 HU. In an embodiment, the light scattering value of the first one of the portions 30 of the light scattering encapsulant layer 20 is 0.5 HU to 3 HU. In an embodiment, the light scattering value of the first one of the portions 30 of the light scattering encapsulant layer 20 is 0.5 HU to 2 HU. In an embodiment, the light scattering value of the first one of the portions 30 of the light scattering encapsulant layer 20 is 0.5 HU to 1 HU.

In an embodiment, the light scattering value of the first one of the portions 30 of the light scattering encapsulant layer 20 is 1 HU to 12 HU. In an embodiment, the light scattering value of the first one of the portions 30 of the light scattering encapsulant layer 20 is 1 HU to 11 HU. In an embodiment, the light scattering value of the first one of the portions 30 of the light scattering encapsulant layer 20 is 1 HU to 10 HU. In an embodiment, the light scattering value of the first one of the portions 30 of the light scattering encapsulant layer 20 is 1 HU to 9 HU. In an embodiment, the light scattering value of the first one of the portions 30 of the light scattering encapsulant layer 20 is 1 HU to 8 HU. In an embodiment, the light scattering value of the first one of the portions 30 of the light scattering encapsulant layer 20 is 1 HU to 7 HU. In an embodiment, the light scattering value of the first one of the portions 30 of the light scattering encapsulant layer 20 is 1 HU to 6 HU. In an embodiment, the light scattering value of the first one of the portions 30 of the light scattering encapsulant layer 20 is 1 HU to 5 HU. In an embodiment, the light scattering value of the first one of the portions 30 of the light scattering encapsulant layer 20 is 1 HU to 4 HU. In an embodiment, the light scattering value of the first one of the portions 30 of the light scattering encapsulant layer 20 is 1 HU to 3 HU. In an embodiment, the light scattering value of the first one of the portions 30 of the light scattering encapsulant layer 20 is 1 HU to 2 HU.

In an embodiment, the light scattering value of the first one of the portions 30 of the light scattering encapsulant layer 20 is 2 HU to 12 HU. In an embodiment, the light scattering value of the first one of the portions 30 of the light scattering encapsulant layer 20 is 2 HU to 11 HU. In an embodiment, the light scattering value of the first one of the portions 30 of the light scattering encapsulant layer 20 is 2 HU to 10 HU. In an embodiment, the light scattering value of the first one of the portions 30 of the light scattering encapsulant layer 20 is 2 HU to 9 HU. In an embodiment, the light scattering value of the first one of the portions 30 of the light scattering encapsulant layer 20 is 2 HU to 8 HU. In an embodiment, the light scattering value of the first one of the portions 30 of the light scattering encapsulant layer 20 is 2 HU to 7 HU. In an embodiment, the light scattering value of the first one of the portions 30 of the light scattering encapsulant layer 20 is 2 HU to 6 HU. In an embodiment, the light scattering value of the first one of the portions 30 of the light scattering encapsulant layer 20 is 2 HU to 5 HU. In an embodiment, the light scattering value of the first one of the portions 30 of the light scattering encapsulant layer 20 is 2 HU to 4 HU. In an embodiment, the light scattering value of the first one of the portions 30 of the light scattering encapsulant layer 20 is 2 HU to 3 HU.

In an embodiment, the light scattering value of the first one of the portions 30 of the light scattering encapsulant layer 20 is 3 HU to 12 HU. In an embodiment, the light scattering value of the first one of the portions 30 of the light scattering encapsulant layer 20 is 3 HU to 11 HU. In an embodiment, the light scattering value of the first one of the portions 30 of the light scattering encapsulant layer 20 is 3 HU to 10 HU. In an embodiment, the light scattering value of the first one of the portions 30 of the light scattering encapsulant layer 20 is 3 HU to 9 HU. In an embodiment, the light scattering value of the first one of the portions 30 of the light scattering encapsulant layer 20 is 3 HU to 8 HU. In an embodiment, the light scattering value of the first one of the portions 30 of the light scattering encapsulant layer 20 is 3 HU to 7 HU. In an embodiment, the light scattering value of the first one of the portions 30 of the light scattering encapsulant layer 20 is 3 HU to 6 HU. In an embodiment, the light scattering value of the first one of the portions 30 of the light scattering encapsulant layer 20 is 3 HU to 5 HU. In an embodiment, the light scattering value of the first one of the portions 30 of the light scattering encapsulant layer 20 is 3 HU to 4 HU.

In an embodiment, the light scattering value of the first one of the portions 30 of the light scattering encapsulant layer 20 is 4 HU to 12 HU. In an embodiment, the light scattering value of the first one of the portions 30 of the light scattering encapsulant layer 20 is 4 HU to 11 HU. In an embodiment, the light scattering value of the first one of the portions 30 of the light scattering encapsulant layer 20 is 4 HU to 10 HU. In an embodiment, the light scattering value of the first one of the portions 30 of the light scattering encapsulant layer 20 is 4 HU to 9 HU. In an embodiment, the light scattering value of the first one of the portions 30 of the light scattering encapsulant layer 20 is 4 HU to 8 HU. In an embodiment, the light scattering value of the first one of the portions 30 of the light scattering encapsulant layer 20 is 4 HU to 7 HU. In an embodiment, the light scattering value of the first one of the portions 30 of the light scattering encapsulant layer 20 is 4 HU to 6 HU. In an embodiment, the light scattering value of the first one of the portions 30 of the light scattering encapsulant layer 20 is 4 HU to 5 HU.

In an embodiment, the light scattering value of the first one of the portions 30 of the light scattering encapsulant layer 20 is 5 HU to 12 HU. In an embodiment, the light scattering value of the first one of the portions 30 of the light scattering encapsulant layer 20 is 5 HU to 11 HU. In an embodiment, the light scattering value of the first one of the portions 30 of the light scattering encapsulant layer 20 is 5 HU to 10 HU. In an embodiment, the light scattering value of the first one of the portions 30 of the light scattering encapsulant layer 20 is 5 HU to 9 HU. In an embodiment, the light scattering value of the first one of the portions 30 of the light scattering encapsulant layer 20 is 5 HU to 8 HU. In an embodiment, the light scattering value of the first one of the portions 30 of the light scattering encapsulant layer 20 is 5 HU to 7 HU. In an embodiment, the light scattering value of the first one of the portions 30 of the light scattering encapsulant layer 20 is 5 HU to 6 HU.

In an embodiment, the light scattering value of the first one of the portions 30 of the light scattering encapsulant layer 20 is 6 HU to 12 HU. In an embodiment, the light scattering value of the first one of the portions 30 of the light scattering encapsulant layer 20 is 6 HU to 11 HU. In an embodiment, the light scattering value of the first one of the portions 30 of the light scattering encapsulant layer 20 is 6 HU to 10 HU. In an embodiment, the light scattering value of the first one of the portions 30 of the light scattering encapsulant layer 20 is 6 HU to 9 HU. In an embodiment, the light scattering value of the first one of the portions 30 of the light scattering encapsulant layer 20 is 6 HU to 8 HU. In an embodiment, the light scattering value of the first one of the portions 30 of the light scattering encapsulant layer 20 is 6 HU to 7 HU.

In an embodiment, the light scattering value of the first one of the portions 30 of the light scattering encapsulant layer 20 is 7 HU to 12 HU. In an embodiment, the light scattering value of the first one of the portions 30 of the light scattering encapsulant layer 20 is 7 HU to 11 HU. In an embodiment, the light scattering value of the first one of the portions 30 of the light scattering encapsulant layer 20 is 7 HU to 10 HU. In an embodiment, the light scattering value of the first one of the portions 30 of the light scattering encapsulant layer 20 is 7 HU to 9 HU. In an embodiment, the light scattering value of the first one of the portions 30 of the light scattering encapsulant layer 20 is 7 HU to 8 HU. In an embodiment, the light scattering value of the first one of the portions 30 of the light scattering encapsulant layer 20 is 8 HU to 12 HU. In an embodiment, the light scattering value of the first one of the portions 30 of the light scattering encapsulant layer 20 is 8 HU to 11 HU. In an embodiment, the light scattering value of the first one of the portions 30 of the light scattering encapsulant layer 20 is 8 HU to 10 HU. In an embodiment, the light scattering value of the first one of the portions 30 of the light scattering encapsulant layer 20 is 8 HU to 9 HU.

In an embodiment, the light scattering value of the first one of the portions 30 of the light scattering encapsulant layer 20 is 9 HU to 12 HU. In an embodiment, the light scattering value of the first one of the portions 30 of the light scattering encapsulant layer 20 is 9 HU to 11 HU. In an embodiment, the light scattering value of the first one of the portions 30 of the light scattering encapsulant layer 20 is 9 HU to 10 HU. In an embodiment, the light scattering value of the first one of the portions 30 of the light scattering encapsulant layer 20 is 10 HU to 12 HU. In an embodiment, the light scattering value of the first one of the portions 30 of the light scattering encapsulant layer 20 is 10 HU to 11 HU. In an embodiment, the light scattering value of the first one of the portions 30 of the light scattering encapsulant layer 20 is 11 HU to 12 HU.

In an embodiment, the light scattering value of the first one of the portions 30 of the light scattering encapsulant layer 20 is 0.1 HU. In an embodiment, the light scattering value of the first one of the portions 30 of the light scattering encapsulant layer 20 is 0.5 HU. In an embodiment, the light scattering value of the first one of the portions 30 of the light scattering encapsulant layer 20 is 1 HU. In an embodiment, the light scattering value of the first one of the portions 30 of the light scattering encapsulant layer 20 is 2 HU. In an embodiment, the light scattering value of the first one of the portions 30 of the light scattering encapsulant layer 20 is 3 HU. In an embodiment, the light scattering value of the first one of the portions 30 of the light scattering encapsulant layer 20 is 4 HU. In an embodiment, the light scattering value of the first one of the portions 30 of the light scattering encapsulant layer 20 is 5 HU. In an embodiment, the light scattering value of the first one of the portions 30 of the light scattering encapsulant layer 20 is 6 HU. In an embodiment, the light scattering value of the first one of the portions 30 of the light scattering encapsulant layer 20 is 7 HU. In an embodiment, the light scattering value of the first one of the portions 30 of the light scattering encapsulant layer 20 is 8 HU. In an embodiment, the light scattering value of the first one of the portions 30 of the light scattering encapsulant layer 20 is 9 HU. In an embodiment, the light scattering value of the first one of the portions 30 of the light scattering encapsulant layer 20 is 10 HU. In an embodiment, the light scattering value of the first one of the portions 30 of the light scattering encapsulant layer 20 is 11 HU. In an embodiment, the light scattering value of the first one of the portions 30 of the light scattering encapsulant layer 20 is 12 HU.

In an embodiment, the light scattering value of the second one of the portions 30 of the light scattering encapsulant layer 20 is 0.1 HU to 12 HU. In an embodiment, the light scattering value of the second one of the portions 30 of the light scattering encapsulant layer 20 is 0.1 HU to 11 HU. In an embodiment, the light scattering value of the second one of the portions 30 of the light scattering encapsulant layer 20 is 0.1 HU to 10 HU. In an embodiment, the light scattering value of the second one of the portions 30 of the light scattering encapsulant layer 20 is 0.1 HU to 9 HU. In an embodiment, the light scattering value of the second one of the portions 30 of the light scattering encapsulant layer 20 is 0.1 HU to 8 HU. In an embodiment, the light scattering value of the second one of the portions 30 of the light scattering encapsulant layer 20 is 0.1 HU to 7 HU. In an embodiment, the light scattering value of the second one of the portions 30 of the light scattering encapsulant layer 20 is 0.1 HU to 6 HU. In an embodiment, the light scattering value of the second one of the portions 30 of the light scattering encapsulant layer 20 is 0.1 HU to 5 HU. In an embodiment, the light scattering value of the second one of the portions 30 of the light scattering encapsulant layer 20 is 0.1 HU to 4 HU. In an embodiment, the light scattering value of the second one of the portions 30 of the light scattering encapsulant layer 20 is 0.1 HU to 3 HU. In an embodiment, the light scattering value of the second one of the portions 30 of the light scattering encapsulant layer 20 is 0.1 HU to 2 HU. In an embodiment, the light scattering value of the second one of the portions 30 of the light scattering encapsulant layer 20 is 0.1 HU to 1 HU. In an embodiment, the light scattering value of the second one of the portions 30 of the light scattering encapsulant layer 20 is 0.1 HU to 0.5 HU.

In an embodiment, the light scattering value of the second one of the portions 30 of the light scattering encapsulant layer 20 is 0.5 HU to 12 HU. In an embodiment, the light scattering value of the second one of the portions 30 of the light scattering encapsulant layer 20 is 0.5 HU to 11 HU. In an embodiment, the light scattering value of the second one of the portions 30 of the light scattering encapsulant layer 20 is 0.5 HU to 10 HU. In an embodiment, the light scattering value of the second one of the portions 30 of the light scattering encapsulant layer 20 is 0.5 HU to 9 HU. In an embodiment, the light scattering value of the second one of the portions 30 of the light scattering encapsulant layer 20 is 0.5 HU to 8 HU. In an embodiment, the light scattering value of the second one of the portions 30 of the light scattering encapsulant layer 20 is 0.5 HU to 7 HU. In an embodiment, the light scattering value of the second one of the portions 30 of the light scattering encapsulant layer 20 is 0.5 HU to 6 HU. In an embodiment, the light scattering value of the second one of the portions 30 of the light scattering encapsulant layer 20 is 0.5 HU to 5 HU. In an embodiment, the light scattering value of the second one of the portions 30 of the light scattering encapsulant layer 20 is 0.5 HU to 4 HU. In an embodiment, the light scattering value of the second one of the portions 30 of the light scattering encapsulant layer 20 is 0.5 HU to 3 HU. In an embodiment, the light scattering value of the second one of the portions 30 of the light scattering encapsulant layer 20 is 0.5 HU to 2 HU. In an embodiment, the light scattering value of the second one of the portions 30 of the light scattering encapsulant layer 20 is 0.5 HU to 1 HU.

In an embodiment, the light scattering value of the second one of the portions 30 of the light scattering encapsulant layer 20 is 1 HU to 12 HU. In an embodiment, the light scattering value of the second one of the portions 30 of the light scattering encapsulant layer 20 is 1 HU to 11 HU. In an embodiment, the light scattering value of the second one of the portions 30 of the light scattering encapsulant layer 20 is 1 HU to 10 HU. In an embodiment, the light scattering value of the second one of the portions 30 of the light scattering encapsulant layer 20 is 1 HU to 9 HU. In an embodiment, the light scattering value of the second one of the portions 30 of the light scattering encapsulant layer 20 is 1 HU to 8 HU. In an embodiment, the light scattering value of the second one of the portions 30 of the light scattering encapsulant layer 20 is 1 HU to 7 HU. In an embodiment, the light scattering value of the second one of the portions 30 of the light scattering encapsulant layer 20 is 1 HU to 6 HU. In an embodiment, the light scattering value of the second one of the portions 30 of the light scattering encapsulant layer 20 is 1 HU to 5 HU. In an embodiment, the light scattering value of the second one of the portions 30 of the light scattering encapsulant layer 20 is 1 HU to 4 HU. In an embodiment, the light scattering value of the second one of the portions 30 of the light scattering encapsulant layer 20 is 1 HU to 3 HU. In an embodiment, the light scattering value of the second one of the portions 30 of the light scattering encapsulant layer 20 is 1 HU to 2 HU.

In an embodiment, the light scattering value of the second one of the portions 30 of the light scattering encapsulant layer 20 is 2 HU to 12 HU. In an embodiment, the light scattering value of the second one of the portions 30 of the light scattering encapsulant layer 20 is 2 HU to 11 HU. In an embodiment, the light scattering value of the second one of the portions 30 of the light scattering encapsulant layer 20 is 2 HU to 10 HU. In an embodiment, the light scattering value of the second one of the portions 30 of the light scattering encapsulant layer 20 is 2 HU to 9 HU. In an embodiment, the light scattering value of the second one of the portions 30 of the light scattering encapsulant layer 20 is 2 HU to 8 HU. In an embodiment, the light scattering value of the second one of the portions 30 of the light scattering encapsulant layer 20 is 2 HU to 7 HU. In an embodiment, the light scattering value of the second one of the portions 30 of the light scattering encapsulant layer 20 is 2 HU to 6 HU. In an embodiment, the light scattering value of the second one of the portions 30 of the light scattering encapsulant layer 20 is 2 HU to 5 HU. In an embodiment, the light scattering value of the second one of the portions 30 of the light scattering encapsulant layer 20 is 2 HU to 4 HU. In an embodiment, the light scattering value of the second one of the portions 30 of the light scattering encapsulant layer 20 is 2 HU to 3 HU.

In an embodiment, the light scattering value of the second one of the portions 30 of the light scattering encapsulant layer 20 is 3 HU to 12 HU. In an embodiment, the light scattering value of the second one of the portions 30 of the light scattering encapsulant layer 20 is 3 HU to 11 HU. In an embodiment, the light scattering value of the second one of the portions 30 of the light scattering encapsulant layer 20 is 3 HU to 10 HU. In an embodiment, the light scattering value of the second one of the portions 30 of the light scattering encapsulant layer 20 is 3 HU to 9 HU. In an embodiment, the light scattering value of the second one of the portions 30 of the light scattering encapsulant layer 20 is 3 HU to 8 HU. In an embodiment, the light scattering value of the second one of the portions 30 of the light scattering encapsulant layer 20 is 3 HU to 7 HU. In an embodiment, the light scattering value of the second one of the portions 30 of the light scattering encapsulant layer 20 is 3 HU to 6 HU. In an embodiment, the light scattering value of the second one of the portions 30 of the light scattering encapsulant layer 20 is 3 HU to 5 HU. In an embodiment, the light scattering value of the second one of the portions 30 of the light scattering encapsulant layer 20 is 3 HU to 4 HU.

In an embodiment, the light scattering value of the second one of the portions 30 of the light scattering encapsulant layer 20 is 4 HU to 12 HU. In an embodiment, the light scattering value of the second one of the portions 30 of the light scattering encapsulant layer 20 is 4 HU to 11 HU. In an embodiment, the light scattering value of the second one of the portions 30 of the light scattering encapsulant layer 20 is 4 HU to 10 HU. In an embodiment, the light scattering value of the second one of the portions 30 of the light scattering encapsulant layer 20 is 4 HU to 9 HU. In an embodiment, the light scattering value of the second one of the portions 30 of the light scattering encapsulant layer 20 is 4 HU to 8 HU. In an embodiment, the light scattering value of the second one of the portions 30 of the light scattering encapsulant layer 20 is 4 HU to 7 HU. In an embodiment, the light scattering value of the second one of the portions 30 of the light scattering encapsulant layer 20 is 4 HU to 6 HU. In an embodiment, the light scattering value of the second one of the portions 30 of the light scattering encapsulant layer 20 is 4 HU to 5 HU.

In an embodiment, the light scattering value of the second one of the portions 30 of the light scattering encapsulant layer 20 is 5 HU to 12 HU. In an embodiment, the light scattering value of the second one of the portions 30 of the light scattering encapsulant layer 20 is 5 HU to 11 HU. In an embodiment, the light scattering value of the second one of the portions 30 of the light scattering encapsulant layer 20 is 5 HU to 10 HU. In an embodiment, the light scattering value of the second one of the portions 30 of the light scattering encapsulant layer 20 is 5 HU to 9 HU. In an embodiment, the light scattering value of the second one of the portions 30 of the light scattering encapsulant layer 20 is 5 HU to 8 HU. In an embodiment, the light scattering value of the second one of the portions 30 of the light scattering encapsulant layer 20 is 5 HU to 7 HU. In an embodiment, the light scattering value of the second one of the portions 30 of the light scattering encapsulant layer 20 is 5 HU to 6 HU.

In an embodiment, the light scattering value of the second one of the portions 30 of the light scattering encapsulant layer 20 is 6 HU to 12 HU. In an embodiment, the light scattering value of the second one of the portions 30 of the light scattering encapsulant layer 20 is 6 HU to 11 HU. In an embodiment, the light scattering value of the second one of the portions 30 of the light scattering encapsulant layer 20 is 6 HU to 10 HU. In an embodiment, the light scattering value of the second one of the portions 30 of the light scattering encapsulant layer 20 is 6 HU to 9 HU. In an embodiment, the light scattering value of the second one of the portions 30 of the light scattering encapsulant layer 20 is 6 HU to 8 HU. In an embodiment, the light scattering value of the second one of the portions 30 of the light scattering encapsulant layer 20 is 6 HU to 7 HU.

In an embodiment, the light scattering value of the second one of the portions 30 of the light scattering encapsulant layer 20 is 7 HU to 12 HU. In an embodiment, the light scattering value of the second one of the portions 30 of the light scattering encapsulant layer 20 is 7 HU to 11 HU. In an embodiment, the light scattering value of the second one of the portions 30 of the light scattering encapsulant layer 20 is 7 HU to 10 HU. In an embodiment, the light scattering value of the second one of the portions 30 of the light scattering encapsulant layer 20 is 7 HU to 9 HU. In an embodiment, the light scattering value of the second one of the portions 30 of the light scattering encapsulant layer 20 is 7 HU to 8 HU. In an embodiment, the light scattering value of the second one of the portions 30 of the light scattering encapsulant layer 20 is 8 HU to 12 HU. In an embodiment, the light scattering value of the second one of the portions 30 of the light scattering encapsulant layer 20 is 8 HU to 11 HU. In an embodiment, the light scattering value of the second one of the portions 30 of the light scattering encapsulant layer 20 is 8 HU to 10 HU. In an embodiment, the light scattering value of the second one of the portions 30 of the light scattering encapsulant layer 20 is 8 HU to 9 HU.

In an embodiment, the light scattering value of the second one of the portions 30 of the light scattering encapsulant layer 20 is 9 HU to 12 HU. In an embodiment, the light scattering value of the second one of the portions 30 of the light scattering encapsulant layer 20 is 9 HU to 11 HU. In an embodiment, the light scattering value of the second one of the portions 30 of the light scattering encapsulant layer 20 is 9 HU to 10 HU. In an embodiment, the light scattering value of the second one of the portions 30 of the light scattering encapsulant layer 20 is 10 HU to 12 HU. In an embodiment, the light scattering value of the second one of the portions 30 of the light scattering encapsulant layer 20 is 10 HU to 11 HU. In an embodiment, the light scattering value of the second one of the portions 30 of the light scattering encapsulant layer 20 is 11 HU to 12 HU.

In an embodiment, the light scattering value of the second one of the portions 30 of the light scattering encapsulant layer 20 is 0.1 HU. In an embodiment, the light scattering value of the second one of the portions 30 of the light scattering encapsulant layer 20 is 0.5 HU. In an embodiment, the light scattering value of the second one of the portions 30 of the light scattering encapsulant layer 20 is 1 HU. In an embodiment, the light scattering value of the second one of the portions 30 of the light scattering encapsulant layer 20 is 2 HU. In an embodiment, the light scattering value of the second one of the portions 30 of the light scattering encapsulant layer 20 is 3 HU. In an embodiment, the light scattering value of the second one of the portions 30 of the light scattering encapsulant layer 20 is 4 HU. In an embodiment, the light scattering value of the second one of the portions 30 of the light scattering encapsulant layer 20 is 5 HU. In an embodiment, the light scattering value of the second one of the portions 30 of the light scattering encapsulant layer 20 is 6 HU. In an embodiment, the light scattering value of the second one of the portions 30 of the light scattering encapsulant layer 20 is 7 HU. In an embodiment, the light scattering value of the second one of the portions 30 of the light scattering encapsulant layer 20 is 8 HU. In an embodiment, the light scattering value of the second one of the portions 30 of the light scattering encapsulant layer 20 is 9 HU. In an embodiment, the light scattering value of the second one of the portions 30 of the light scattering encapsulant layer 20 is 10 HU. In an embodiment, the light scattering value of the second one of the portions 30 of the light scattering encapsulant layer 20 is 11 HU. In an embodiment, the light scattering value of the second one of the portions 30 of the light scattering encapsulant layer 20 is 12 HU.

In an embodiment, a light scattering effect of the first one of the portions 30 of the light scattering encapsulant layer 20 is different than a light scattering value effect of the second one of the portions 30 of the light scattering encapsulant layer 20. In an embodiment, the light scattering effect of the first one of the portions 30 and the light scattering effect of the second portion of the light scattering encapsulant layer 20 are visually perceptible by a human. In an embodiment, the visual perception of the light scattering effect of the first one of the portions 30 and the light scattering effect of the second one of the portions 30 of the light scattering encapsulant layer 20 are subjective to the human.

In some embodiments, the light scatting properties of the portions 30 of the light scattering encapsulant layer 20 vary as a result of the degree of crystallinity in each such portion. In some embodiments, the degree of crystallinity in each portion 30 depends on the rate of cooling of each portion 30. In some embodiments, variations in crystallinity result in varying degrees of light scattering (e.g., redirection), resulting in a visual appearance of difference in coloration. In some embodiments, variation in light scattering properties does not result in a significant decrease in overall power of light transmitted through the light scattering encapsulant layer 20 having such portions (e.g., less than 2% relative to an encapsulant equivalent to the light scattering encapsulant layer 20 but exhibiting substantially no light scattering). In other embodiments, a color coordinate and color difference values of each of the at least two of the portions 30 of the light scattering encapsulant layer 20 can be quantified in accordance with the ASTM E1347 Standard Test Method for Color and Color-Difference Measurement by Tristimulus Colorimetry.

In an embodiment, the upper surface of the polymer layer 22 is hazed. In an embodiment, the entire surface area of the upper surface of the polymer layer 22 is hazed. In an embodiment, 40% to 100% of the upper surface of the polymer layer 22 is hazed. In an embodiment, 40% to 90% of the upper surface of the polymer layer 22 is hazed. In an embodiment, 40% to 80% of the upper surface of the polymer layer 22 is hazed. In an embodiment, 40% to 70% of the upper surface of the polymer layer 22 is hazed. In an embodiment, 40% to 60% of the upper surface of the polymer layer 22 is hazed. In an embodiment, 40% to 50% of the upper surface of the polymer layer 22 is hazed. In an embodiment, the upper surface of the polymer layer 22 is hazed. In an embodiment, the entire surface area of the upper surface of the polymer layer 22 is hazed. In an embodiment, 50% to 100% of the upper surface of the polymer layer 22 is hazed. In an embodiment, 50% to 90% of the upper surface of the polymer layer 22 is hazed. In an embodiment, 50% to 80% of the upper surface of the polymer layer 22 is hazed. In an embodiment, 50% to 70% of the upper surface of the polymer layer 22 is hazed. In an embodiment, 50% to 60% of the upper surface of the polymer layer 22 is hazed.

In an embodiment, 60% to 100% of the upper surface of the polymer layer 22 is hazed. In an embodiment, 60% to 90% of the upper surface of the polymer layer 22 is hazed. In an embodiment, 60% to 80% of the upper surface of the polymer layer 22 is hazed. In an embodiment, 60% to 70% of the upper surface of the polymer layer 22 is hazed. In an embodiment, 70% to 100% of the upper surface of the polymer layer 22 is hazed. In an embodiment, 70% to 90% of the upper surface of the polymer layer 22 is hazed. In an embodiment, 70% to 80% of the upper surface of the polymer layer 22 is hazed. In an embodiment, 80% to 100% of the upper surface of the polymer layer 22 is hazed. In an embodiment, 80% to 90% of the upper surface of the polymer layer 22 is hazed. In an embodiment, 90% to 100% of the upper surface of the polymer layer 22 is hazed.

In an embodiment, 40% of the upper surface of the polymer layer 22 is hazed. In an embodiment, 50% of the upper surface of the polymer layer 22 is hazed. In an embodiment, 60% of the upper surface of the polymer layer 22 is hazed. In an embodiment, 70% of the upper surface of the polymer layer 22 is hazed. In an embodiment, 80% of the upper surface of the polymer layer 22 is hazed. In an embodiment, 90% of the upper surface of the polymer layer 22 is hazed. In an embodiment, 99.9% of the upper surface of the polymer layer 22 is hazed. In an embodiment, 100% of the upper surface of the polymer layer 22 is hazed. In an embodiment, at least one embossing layer 34 is juxtaposed with an outer surface 36 of the polymer layer 22. In an embodiment, the at least one embossing layer 34 includes a plurality of the embossing layers 34. In an embodiment, the at least one embossing layer 34 is made from silicone. In an embodiment, at least one the embossing layer 34 is made from high-temperature silicone. In an embodiment, the at least one embossing layer 34 has a size and shape that is approximately equal to the size and shape of a corresponding one of the at least one area 32 of the light scattering encapsulant layer 20. In an embodiment, the at least one embossing layer 34 provides stability for the "dragontooth" shape of the light scattering encapsulant layer 20 during the lamination process of the frontsheet 16. In an embodiment, the at least one embossing layer 34 is removed after the lamination process.

In an embodiment, the frontsheet 16 includes a solar weighted transmittance of 80% to 95%. In an embodiment, the frontsheet 16 includes a solar weighted transmittance of 80% to 90%. In an embodiment, the frontsheet 16 includes a solar weighted transmittance of 80% to 85%. In an embodiment, the frontsheet 16 includes a solar weighted transmittance of 85% to 95%. In an embodiment, the frontsheet 16 includes a solar weighted transmittance of 85% to 90%. In an embodiment, the frontsheet 16 includes a solar weighted transmittance of 90% to 95%.

In an embodiment, a backsheet 38 is juxtaposed with the second layer 14b of the encapsulant 14. In an embodiment, the backsheet 38 includes a first layer 40. In an embodiment, the backsheet 38 includes a second layer 42. In an embodiment, the first layer 40 and the second layer 42 are attached to one another by an adhesive layer 44. In some embodiments, none of the layers of the photovoltaic module 10 is painted. In some embodiments, the frontsheet 16 and the backsheet 38 are unpainted.

In an embodiment, the first layer 40 includes thermoplastic polyolefin (TPO). In an embodiment, the first layer 40 includes a single ply TPO roofing membrane. In an embodiment, the first layer 40 is colored black. In an embodiment, the second layer 42 includes thermoplastic polyolefin (TPO). In an embodiment, the second layer 42 includes a single ply TPO roofing membrane. In other embodiments, non-limiting examples of TPO membranes are disclosed in U.S. Pat. No. 9,359,014 to Yang et al., which is incorporated by reference herein in its entirety.

In another embodiment, the first layer 40 includes polyvinyl chloride. In an embodiment, the first layer 40 includes ethylene propylene diene monomer (EPDM) rubber. In another embodiment, the second layer 42 includes polyvinyl chloride. In an embodiment, the second layer 42 includes ethylene propylene diene monomer (EPDM) rubber In an embodiment, the first layer 40 includes a flame retardant additive. In an embodiment, the second layer 42 includes a flame retardant additive. In some embodiments, the flame retardant additive may be clays, nanoclays, silicas, carbon black, metal hydroxides such as aluminum hydroxide, metal foils, graphite, and combinations thereof.

In an embodiment, the first layer 40 of the backsheet 38 includes a thickness of 10 mil to 100 mil. In an embodiment, the first layer 40 of the backsheet 38 includes a thickness of 10 mil to 90 mil. In an embodiment, the first layer 40 of the backsheet 38 includes a thickness of 10 mil to 80 mil. In an embodiment, the first layer 40 of the backsheet 38 includes a thickness of 10 mil to 70 mil. In an embodiment, the first layer 40 of the backsheet 38 includes a thickness of 10 mil to 60 mil. In an embodiment, the first layer 40 of the backsheet 38 includes a thickness of 10 mil to 50 mil. In an embodiment, the first layer 40 of the backsheet 38 includes a thickness of 10 mil to 40 mil. In an embodiment, the first layer 40 of the backsheet 38 includes a thickness of 10 mil to 30 mil. In an embodiment, the first layer 40 of the backsheet 38 includes a thickness of 10 mil to 20 mil.

In an embodiment, the first layer 40 of the backsheet 38 includes a thickness of 20 mil to 100 mil. In an embodiment, the first layer 40 of the backsheet 38 includes a thickness of 20 mil to 90 mil. In an embodiment, the first layer 40 of the backsheet 38 includes a thickness of 20 mil to 80 mil. In an embodiment, the first layer 40 of the backsheet 38 includes a thickness of 20 mil to 70 mil. In an embodiment, the first layer 40 of the backsheet 38 includes a thickness of 20 mil to 60 mil. In an embodiment, the first layer 40 of the backsheet 38 includes a thickness of 20 mil to 50 mil. In an embodiment, the first layer 40 of the backsheet 38 includes a thickness of 20 mil to 40 mil. In an embodiment, the first layer 40 of the backsheet 38 includes a thickness of 20 mil to 30 mil.

In an embodiment, the first layer 40 of the backsheet 38 includes a thickness of 30 mil to 100 mil. In an embodiment, the first layer 40 of the backsheet 38 includes a thickness of 30 mil to 90 mil. In an embodiment, the first layer 40 of the backsheet 38 includes a thickness of 30 mil to 80 mil. In an embodiment, the first layer 40 of the backsheet 38 includes a thickness of 30 mil to 70 mil. In an embodiment, the first layer 40 of the backsheet 38 includes a thickness of 30 mil to 60 mil. In an embodiment, the first layer 40 of the backsheet 38 includes a thickness of 30 mil to 50 mil. In an embodiment, the first layer 40 of the backsheet 38 includes a thickness of 30 mil to 40 mil.

In an embodiment, the first layer 40 of the backsheet 38 includes a thickness of 40 mil to 100 mil. In an embodiment, the first layer 40 of the backsheet 38 includes a thickness of 40 mil to 90 mil. In an embodiment, the first layer 40 of the backsheet 38 includes a thickness of 40 mil to 80 mil. In an embodiment, the first layer 40 of the backsheet 38 includes a thickness of 40 mil to 70 mil. In an embodiment, the first layer 40 of the backsheet 38 includes a thickness of 40 mil to 60 mil. In an embodiment, the first layer 40 of the backsheet 38 includes a thickness of 40 mil to 50 mil.

In an embodiment, the first layer 40 of the backsheet 38 includes a thickness of 50 mil to 100 mil. In an embodiment, the first layer 40 of the backsheet 38 includes a thickness of 50 mil to 90 mil. In an embodiment, the first layer 40 of the backsheet 38 includes a thickness of 50 mil to 80 mil. In an embodiment, the first layer 40 of the backsheet 38 includes a thickness of 50 mil to 70 mil. In an embodiment, the first layer 40 of the backsheet 38 includes a thickness of 50 mil to 60 mil.

In an embodiment, the first layer 40 of the backsheet 38 includes a thickness of 60 mil to 100 mil. In an embodiment, the first layer 40 of the backsheet 38 includes a thickness of 60 mil to 90 mil. In an embodiment, the first layer 40 of the backsheet 38 includes a thickness of 60 mil to 80 mil. In an embodiment, the first layer 40 of the backsheet 38 includes a thickness of 60 mil to 70 mil.

In an embodiment, the first layer 40 of the backsheet 38 includes a thickness of 70 mil to 100 mil. In an embodiment, the first layer 40 of the backsheet 38 includes a thickness of 70 mil to 90 mil. In an embodiment, the first layer 40 of the backsheet 38 includes a thickness of 70 mil to 80 mil.

In an embodiment, the first layer 40 of the backsheet 38 includes a thickness of 80 mil to 100 mil. In an embodiment, the first layer 40 of the backsheet 38 includes a thickness of 80 mil to 90 mil. In an embodiment, the first layer 40 of the backsheet 38 includes a thickness of 90 mil to 100 mil.

In an embodiment, the first layer 40 of the backsheet 38 includes a thickness of 10 mil. In an embodiment, the first layer 40 of the backsheet 38 includes a thickness of 20 mil. In an embodiment, the first layer 40 of the backsheet 38 includes a thickness of 30 mil. In an embodiment, the first layer 40 of the backsheet 38 includes a thickness of 40 mil. In an embodiment, the first layer 40 of the backsheet 38 includes a thickness of 50 mil. In an embodiment, the first layer 40 of the backsheet 38 includes a thickness of 60 mil. In an embodiment, the first layer 40 of the backsheet 38 includes a thickness of 10 mil. In an embodiment, the first layer 40 of the backsheet 38 includes a thickness of 70 mil. In an embodiment, the first layer 40 of the backsheet 38 includes a thickness of 80 mil. In an embodiment, the first layer 40 of the backsheet 38 includes a thickness of 90 mil. In an embodiment, the first layer 40 of the backsheet 38 includes a thickness of 100 mil.

In an embodiment, the second layer 42 of the backsheet 38 includes a thickness of 10 mil to 100 mil. In an embodiment, the second layer 42 of the backsheet 38 includes a thickness of 10 mil to 90 mil. In an embodiment, the second layer 42 of the backsheet 38 includes a thickness of 10 mil to 80 mil. In an embodiment, the second layer 42 of the backsheet 38 includes a thickness of 10 mil to 70 mil. In an embodiment, the second layer 42 of the backsheet 38 includes a thickness of 10 mil to 60 mil. In an embodiment, the second layer 42 of the backsheet 38 includes a thickness of 10 mil to 50 mil. In an embodiment, the second layer 42 of the backsheet 38 includes a thickness of 10 mil to 40 mil. In an embodiment, the second layer 42 of the backsheet 38 includes a thickness of 10 mil to 30 mil. In an embodiment, the second layer 42 of the backsheet 38 includes a thickness of 10 mil to 20 mil.

In an embodiment, the second layer 42 of the backsheet 38 includes a thickness of 20 mil to 100 mil. In an embodiment, the second layer 42 of the backsheet 38 includes a thickness of 20 mil to 90 mil. In an embodiment, the second layer 42 of the backsheet 38 includes a thickness of 20 mil to 80 mil. In an embodiment, the second layer 42 of the backsheet 38 includes a thickness of 20 mil to 70 mil. In an embodiment, the second layer 42 of the backsheet 38 includes a thickness of 20 mil to 60 mil. In an embodiment, the second layer 42 of the backsheet 38 includes a thickness of 20 mil to 50 mil. In an embodiment, the second layer 42 of the backsheet 38 includes a thickness of 20 mil to 40 mil. In an embodiment, the second layer 42 of the backsheet 38 includes a thickness of 20 mil to 30 mil.

In an embodiment, the second layer 42 of the backsheet 38 includes a thickness of 30 mil to 100 mil. In an embodiment, the second layer 42 of the backsheet 38 includes a thickness of 30 mil to 90 mil. In an embodiment, the second layer 42 of the backsheet 38 includes a thickness of 30 mil to 80 mil. In an embodiment, the second layer 42 of the backsheet 38 includes a thickness of 30 mil to 70 mil. In an embodiment, the second layer 42 of the backsheet 38 includes a thickness of 30 mil to 60 mil. In an embodiment, the second layer 42 of the backsheet 38 includes a thickness of 30 mil to 50 mil. In an embodiment, the second layer 42 of the backsheet 38 includes a thickness of 30 mil to 40 mil.

In an embodiment, the second layer 42 of the backsheet 38 includes a thickness of 40 mil to 100 mil. In an embodiment, the second layer 42 of the backsheet 38 includes a thickness of 40 mil to 90 mil. In an embodiment, the second layer 42 of the backsheet 38 includes a thickness of 40 mil to 80 mil. In an embodiment, the second layer 42 of the backsheet 38 includes a thickness of 40 mil to 70 mil. In an embodiment, the second layer 42 of the backsheet 38 includes a thickness of 40 mil to 60 mil. In an embodiment, the second layer 42 of the backsheet 38 includes a thickness of 40 mil to 50 mil.

In an embodiment, the second layer 42 of the backsheet 38 includes a thickness of 50 mil to 100 mil. In an embodiment, the second layer 42 of the backsheet 38 includes a thickness of 50 mil to 90 mil. In an embodiment, the second layer 42 of the backsheet 38 includes a thickness of 50 mil to 80 mil. In an embodiment, the second layer 42 of the backsheet 38 includes a thickness of 50 mil to 70 mil. In an embodiment, the second layer 42 of the backsheet 38 includes a thickness of 50 mil to 60 mil.

In an embodiment, the second layer 42 of the backsheet 38 includes a thickness of 60 mil to 100 mil. In an embodiment, the second layer 42 of the backsheet 38 includes a thickness of 60 mil to 90 mil. In an embodiment, the second layer 42 of the backsheet 38 includes a thickness of 60 mil to 80 mil. In an embodiment, the second layer 42 of the backsheet 38 includes a thickness of 60 mil to 70 mil.

In an embodiment, the second layer 42 of the backsheet 38 includes a thickness of 70 mil to 100 mil. In an embodiment, the second layer 42 of the backsheet 38 includes a thickness of 70 mil to 90 mil. In an embodiment, the second layer 42 of the backsheet 38 includes a thickness of 70 mil to 80 mil.

In an embodiment, the second layer 42 of the backsheet 38 includes a thickness of 80 mil to 100 mil. In an embodiment, the second layer 42 of the backsheet 38 includes a thickness of 80 mil to 90 mil. In an embodiment, the second layer 42 of the backsheet 38 includes a thickness of 90 mil to 100 mil.

In an embodiment, the second layer 42 of the backsheet 38 includes a thickness of 10 mil. In an embodiment, the second layer 42 of the backsheet 38 includes a thickness of 20 mil. In an embodiment, the second layer 42 of the backsheet 38 includes a thickness of 30 mil. In an embodiment, the second layer 42 of the backsheet 38 includes a thickness of 40 mil. In an embodiment, the second layer 42 of the backsheet 38 includes a thickness of 50 mil. In an embodiment, the second layer 42 of the backsheet 38 includes a thickness of 60 mil. In an embodiment, the second layer 42 of the backsheet 38 includes a thickness of 10 mil. In an embodiment, the second layer 42 of the backsheet 38 includes a thickness of 70 mil. In an embodiment, the second layer 42 of the backsheet 38 includes a thickness of 80 mil. In an embodiment, the second layer 42 of the backsheet 38 includes a thickness of 90 mil. In an embodiment, the second layer 42 of the backsheet 38 includes a thickness of 100 mil.

In an embodiment, the adhesive layer 44 may include polyvinyl butyrate, acrylic, silicone, or polycarbonate. In another embodiment, the adhesive layer 44 may include pressure sensitive adhesives. In another embodiment, the first layer 40 is attached to the second layer 42 by thermal bonding.

In an embodiment, the adhesive layer 44 includes thermosetting polyolefin, thermosetting polyolefin encapsulant material, ethylene-vinyl acetate (EVA), EVA encapsulants, thermoplastic olefin, thermoplastic polyolefin (TPO) or hybrids/combinations thereof.

In an embodiment, the adhesive layer 44 includes a thickness of 1 μm to 900 μm. In an embodiment, the adhesive layer 44 includes a thickness of 1 μm to 900 μm. In an embodiment, the adhesive layer 44 includes a thickness of 1 μm to 850 μm. In an embodiment, the adhesive layer 44 includes a thickness of 1 μm to 800 μm. In an embodiment, the adhesive layer 44 includes a thickness of 1 μm to 750 μm. In an embodiment, the adhesive layer 44 includes a thickness of 1 μm to 700 μm. In an embodiment, the adhesive layer 44 includes a thickness of 1 μm to 650 μm. In an embodiment, the adhesive layer 44 includes a thickness of 1 μm to 600 μm. In an embodiment, the adhesive layer 44 includes a thickness of 1 μm to 550 μm. In an embodiment, the adhesive layer 44 includes a thickness of 1 μm to 500 μm. In an embodiment, the adhesive layer 44 includes a thickness of 1 μm to 450 μm. In an embodiment, the adhesive layer 44 includes a thickness of 1 μm to 400 μm. In an embodiment, the adhesive layer 44 includes a thickness of 1 μm to 350 μm. In an embodiment, the adhesive layer 44 includes a thickness of 1 μm to 300 μm. In an embodiment, the adhesive layer 44 includes a thickness of 1 μm to 250 μm. In an embodiment, the adhesive layer 44 includes a thickness of 1 μm to 200 μm. In an embodiment, the adhesive layer 44 includes a thickness of 1 μm to 150 μm. In an embodiment, the adhesive layer 44 includes a thickness of 1 μm to 100 μm. In an embodiment, the adhesive layer 44 includes a thickness of 1 μm to 50 μm.

In an embodiment, the adhesive layer 44 includes a thickness of 50 μm to 900 μm. In an embodiment, the adhesive layer 44 includes a thickness of 50 μm to 850 μm. In an embodiment, the adhesive layer 44 includes a thickness of 50 μm to 800 μm. In an embodiment, the adhesive layer 44 includes a thickness of 50 μm to 750 μm. In an embodiment, the adhesive layer 44 includes a thickness of 50 μm to 700 μm. In an embodiment, the adhesive layer 44 includes a thickness of 50 μm to 650 μm. In an embodiment, the adhesive layer 44 includes a thickness of 50 μm to 600 μm. In an embodiment, the adhesive layer 44 includes a thickness of 50 μm to 550 μm. In an embodiment, the adhesive layer 44 includes a thickness of 50 μm to 500 μm. In an embodiment, the adhesive layer 44 includes a thickness of 50 μm to 450 μm. In an embodiment, the adhesive layer 44 includes a thickness of 50 μm to 400 μm. In an embodiment, the adhesive layer 44 includes a thickness of 50 μm to 350 μm. In an embodiment, the adhesive layer 44 includes a thickness of 50 μm to 300 μm. In an embodiment, the adhesive layer 44 includes a thickness of 50 μm to 250 μm. In an embodiment, the adhesive layer 44 includes a thickness of 50 μm to 200 μm. In an embodiment, the adhesive layer 44 includes a thickness of 50 μm to 150 μm. In an embodiment, the adhesive layer 44 includes a thickness of 50 μm to 100 μm.

In an embodiment, the adhesive layer 44 includes a thickness of 100 μm to 900 μm. In an embodiment, the adhesive layer 44 includes a thickness of 100 μm to 850 μm. In an embodiment, the adhesive layer 44 includes a thickness of 100 μm to 800 μm. In an embodiment, the adhesive layer 44 includes a thickness of 100 μm to 750 μm. In an embodiment, the adhesive layer 44 includes a thickness of 100 μm to 700 μm. In an embodiment, the adhesive layer 44 includes a thickness of 100 μm to 650 μm. In an embodiment, the adhesive layer 44 includes a thickness of 100 μm to 600 μm. In an embodiment, the adhesive layer 44 includes a thickness of 100 μm to 550 μm. In an embodiment, the adhesive layer 44 includes a thickness of 100 μm to 500 μm. In an embodiment, the adhesive layer 44 includes a thickness of 100 μm to 450 μm. In an embodiment, the adhesive layer 44 includes a thickness of 100 μm to 400 μm. In an embodiment, the adhesive layer 44 includes a thickness of 100 μm to 350 μm. In an embodiment, the adhesive layer 44 includes a thickness of 100 μm to 300 μm. In an embodiment, the adhesive layer 44 includes a thickness of 100 μm to 250 μm. In an embodiment, the adhesive layer 44 includes a thickness of 100 μm to 200 μm. In an embodiment, the adhesive layer 44 includes a thickness of 100 μm to 150 μm.

In an embodiment, the adhesive layer 44 includes a thickness of 150 μm to 900 μm. In an embodiment, the adhesive layer 44 includes a thickness of 150 μm to 850 μm. In an embodiment, the adhesive layer 44 includes a thickness of 150 μm to 800 μm. In an embodiment, the adhesive layer 44 includes a thickness of 150 μm to 750 μm. In an embodiment, the adhesive layer 44 includes a thickness of 150 μm to 700 μm. In an embodiment, the adhesive layer 44 includes a thickness of 150 μm to 650 μm. In an embodiment, the adhesive layer 44 includes a thickness of 150 μm to 600 μm. In an embodiment, the adhesive layer 44 includes a thickness of 150 μm to 550 μm. In an embodiment, the adhesive layer 44 includes a thickness of 150 μm to 500 μm. In an embodiment, the adhesive layer 44 includes a thickness of 150 μm to 450 μm. In an embodiment, the adhesive layer 44 includes a thickness of 150 μm to 400 μm. In an embodiment, the adhesive layer 44 includes a thickness of 150 μm to 350 μm. In an embodiment, the adhesive layer 44 includes a thickness of 150 μm to 300 μm. In an embodiment, the adhesive layer 44 includes a thickness of 150 μm to 250 μm. In an embodiment, the adhesive layer 44 includes a thickness of 150 μm to 200 μm.

In an embodiment, the adhesive layer 44 includes a thickness of 200 μm to 900 μm. In an embodiment, the adhesive layer 44 includes a thickness of 200 μm to 850 μm. In an embodiment, the adhesive layer 44 includes a thickness of 200 μm to 800 μm. In an embodiment, the adhesive layer 44 includes a thickness of 200 μm to 750 μm. In an embodiment, the adhesive layer 44 includes a thickness of 200 μm to 700 μm. In an embodiment, the adhesive layer 44 includes a thickness of 200 μm to 650 μm. In an embodiment, the adhesive layer 44 includes a thickness of 200 μm to 600 μm. In an embodiment, the adhesive layer 44 includes a thickness of 200 μm to 550 μm. In an embodiment, the adhesive layer 44 includes a thickness of 200 μm to 500 μm. In an embodiment, the adhesive layer 44 includes a thickness of 200 μm to 450 μm. In an embodiment, the adhesive layer 44 includes a thickness of 200 μm to 400 μm. In an embodiment, the adhesive layer 44 includes a thickness of 200 μm to 350 μm. In an embodiment, the adhesive layer 44 includes a thickness of 200 μm to 300 μm. In an embodiment, the adhesive layer 44 includes a thickness of 200 μm to 250 μm.

In an embodiment, the adhesive layer 44 includes a thickness of 250 μm to 900 μm. In an embodiment, the adhesive layer 44 includes a thickness of 250 μm to 850 μm. In an embodiment, the adhesive layer 44 includes a thickness of 250 μm to 800 μm. In an embodiment, the adhesive layer 44 includes a thickness of 250 μm to 750 μm. In an embodiment, the adhesive layer 44 includes a thickness of 250 μm to 700 μm. In an embodiment, the adhesive layer 44 includes a thickness of 250 μm to 650 μm. In an embodiment, the adhesive layer 44 includes a thickness of 250 μm to 600 μm. In an embodiment, the adhesive layer 44 includes a thickness of 250 μm to 550 μm. In an embodiment, the adhesive layer 44 includes a thickness of 250 μm to 500 μm. In an embodiment, the adhesive layer 44 includes a thickness of 250 μm to 450 μm. In an embodiment, the adhesive layer 44 includes a thickness of 250 μm to 400 μm. In an embodiment, the adhesive layer 44 includes a thickness of 250 μm to 350 μm. In an embodiment, the adhesive layer 44 includes a thickness of 250 μm to 300 μm.

In an embodiment, the adhesive layer 44 includes a thickness of 300 μm to 900 μm. In an embodiment, the adhesive layer 44 includes a thickness of 300 μm to 850 μm.

In an embodiment, the adhesive layer 44 includes a thickness of 300 μm to 800 μm. In an embodiment, the adhesive layer 44 includes a thickness of 300 μm to 750 μm. In an embodiment, the adhesive layer 44 includes a thickness of 300 μm to 700 μm. In an embodiment, the adhesive layer 44 includes a thickness of 300 μm to 650 μm. In an embodiment, the adhesive layer 44 includes a thickness of 300 μm to 600 μm. In an embodiment, the adhesive layer 44 includes a thickness of 300 μm to 550 μm. In an embodiment, the adhesive layer 44 includes a thickness of 300 μm to 500 μm. In an embodiment, the adhesive layer 44 includes a thickness of 300 μm to 450 μm. In an embodiment, the adhesive layer 44 includes a thickness of 300 μm to 400 μm. In an embodiment, the adhesive layer 44 includes a thickness of 300 μm to 350 μm.

In an embodiment, the adhesive layer 44 includes a thickness of 350 μm to 900 μm. In an embodiment, the adhesive layer 44 includes a thickness of 350 μm to 850 μm. In an embodiment, the adhesive layer 44 includes a thickness of 350 μm to 800 μm. In an embodiment, the adhesive layer 44 includes a thickness of 350 μm to 750 μm. In an embodiment, the adhesive layer 44 includes a thickness of 350 μm to 700 μm. In an embodiment, the adhesive layer 44 includes a thickness of 350 μm to 650 μm. In an embodiment, the adhesive layer 44 includes a thickness of 350 μm to 600 μm. In an embodiment, the adhesive layer 44 includes a thickness of 350 μm to 550 μm. In an embodiment, the adhesive layer 44 includes a thickness of 350 μm to 500 μm. In an embodiment, the adhesive layer 44 includes a thickness of 350 μm to 450 μm. In an embodiment, the adhesive layer 44 includes a thickness of 350 μm to 400 μm.

In an embodiment, the adhesive layer 44 includes a thickness of 400 μm to 900 μm. In an embodiment, the adhesive layer 44 includes a thickness of 400 μm to 850 μm. In an embodiment, the adhesive layer 44 includes a thickness of 400 μm to 800 μm. In an embodiment, the adhesive layer 44 includes a thickness of 400 μm to 750 μm. In an embodiment, the adhesive layer 44 includes a thickness of 400 μm to 700 μm. In an embodiment, the adhesive layer 44 includes a thickness of 400 μm to 650 μm. In an embodiment, the adhesive layer 44 includes a thickness of 400 μm to 600 μm. In an embodiment, the adhesive layer 44 includes a thickness of 400 μm to 550 μm. In an embodiment, the adhesive layer 44 includes a thickness of 400 μm to 500 μm. In an embodiment, the adhesive layer 44 includes a thickness of 400 μm to 450 μm.

In an embodiment, the adhesive layer 44 includes a thickness of 450 μm to 900 μm. In an embodiment, the adhesive layer 44 includes a thickness of 450 μm to 850 μm. In an embodiment, the adhesive layer 44 includes a thickness of 450 μm to 800 μm. In an embodiment, the adhesive layer 44 includes a thickness of 450 μm to 750 μm. In an embodiment, the adhesive layer 44 includes a thickness of 450 μm to 700 μm. In an embodiment, the adhesive layer 44 includes a thickness of 450 μm to 650 μm. In an embodiment, the adhesive layer 44 includes a thickness of 450 μm to 600 μm. In an embodiment, the adhesive layer 44 includes a thickness of 450 μm to 550 μm. In an embodiment, the adhesive layer 44 includes a thickness of 450 μm to 500 μm.

In an embodiment, the adhesive layer 44 includes a thickness of 500 μm to 900 μm. In an embodiment, the adhesive layer 44 includes a thickness of 500 μm to 850 μm. In an embodiment, the adhesive layer 44 includes a thickness of 500 μm to 800 μm. In an embodiment, the adhesive layer 44 includes a thickness of 500 μm to 750 μm. In an embodiment, the adhesive layer 44 includes a thickness of 500 μm to 700 μm. In an embodiment, the adhesive layer 44 includes a thickness of 500 μm to 650 μm. In an embodiment, the adhesive layer 44 includes a thickness of 500 μm to 600 μm. In an embodiment, the adhesive layer 44 includes a thickness of 500 μm to 550 μm.

In an embodiment, the adhesive layer 44 includes a thickness of 550 μm to 900 μm. In an embodiment, the adhesive layer 44 includes a thickness of 550 μm to 850 μm. In an embodiment, the adhesive layer 44 includes a thickness of 550 μm to 800 μm. In an embodiment, the adhesive layer 44 includes a thickness of 550 μm to 750 μm. In an embodiment, the adhesive layer 44 includes a thickness of 550 μm to 700 μm. In an embodiment, the adhesive layer 44 includes a thickness of 550 μm to 650 μm. In an embodiment, the adhesive layer 44 includes a thickness of 550 μm to 600 μm.

In an embodiment, the adhesive layer 44 includes a thickness of 600 μm to 900 μm. In an embodiment, the adhesive layer 44 includes a thickness of 600 μm to 850 μm. In an embodiment, the adhesive layer 44 includes a thickness of 600 μm to 800 μm. In an embodiment, the adhesive layer 44 includes a thickness of 600 μm to 750 μm. In an embodiment, the adhesive layer 44 includes a thickness of 600 μm to 700 μm. In an embodiment, the adhesive layer 44 includes a thickness of 600 μm to 650 μm.

In an embodiment, the adhesive layer 44 includes a thickness of 650 μm to 900 μm. In an embodiment, the adhesive layer 44 includes a thickness of 650 μm to 850 μm. In an embodiment, the adhesive layer 44 includes a thickness of 650 μm to 800 μm. In an embodiment, the adhesive layer 44 includes a thickness of 650 μm to 750 μm. In an embodiment, the adhesive layer 44 includes a thickness of 650 μm to 700 μm. In an embodiment, the adhesive layer 44 includes a thickness of 700 μm to 900 μm. In an embodiment, the adhesive layer 44 includes a thickness of 700 μm to 850 μm. In an embodiment, the adhesive layer 44 includes a thickness of 700 μm to 800 μm. In an embodiment, the adhesive layer 44 includes a thickness of 700 μm to 750 μm. In an embodiment, the adhesive layer 44 includes a thickness of 750 μm to 900 μm. In an embodiment, the adhesive layer 44 includes a thickness of 750 μm to 850 μm. In an embodiment, the adhesive layer 44 includes a thickness of 750 μm to 800 μm. In an embodiment, the adhesive layer 44 includes a thickness of 800 μm to 900 μm. In an embodiment, the adhesive layer 44 includes a thickness of 800 μm to 850 μm. In an embodiment, the adhesive layer 44 includes a thickness of 850 μm to 900 μm.

In an embodiment, the adhesive layer 44 includes a thickness of 1 μm. In an embodiment, the adhesive layer 44 includes a thickness of 50 μm. In an embodiment, the adhesive layer 44 includes a thickness of 100 μm. In an embodiment, the adhesive layer 44 includes a thickness of 1 μm. In an embodiment, the adhesive layer 44 includes a thickness of 150 μm. In an embodiment, the adhesive layer 44 includes a thickness of 200 μm. In an embodiment, the adhesive layer 44 includes a thickness of 250 μm. In an embodiment, the adhesive layer 44 includes a thickness of 300 μm. In an embodiment, the adhesive layer 44 includes a thickness of 350 μm. In an embodiment, the adhesive layer 44 includes a thickness of 400 μm. In an embodiment, the adhesive layer 44 includes a thickness of 450 μm. In an embodiment, the adhesive layer 44 includes a thickness of 500 μm. In an embodiment, the adhesive layer 44 includes a thickness of 550 μm. In an embodiment, the adhesive layer 44 includes a thickness of 600 μm. In an embodiment, the adhesive layer 44 includes a thickness of 650 μm. In an embodiment, the adhesive layer 44 includes a thickness of 700 μm. In an embodiment, the adhesive layer 44 includes a thickness of 750 µm. In an embodiment, the adhesive layer 44 includes a thickness of 800 µm. In an embodiment, the adhesive layer 44 includes a thickness of 850 µm. In an embodiment, the adhesive layer 44 includes a thickness of 900 µm. In an embodiment, the photovoltaic module 10 is configured to be installed on a roof deck. In an embodiment, the roof deck is steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof. In an embodiment, the photovoltaic module 10 is an electrically active photovoltaic module. In another embodiment, the photovoltaic module 10 is an electrically inactive photovoltaic module. In an embodiment, the photovoltaic module 10 when electrically inactive meets standards of California Building Energy Efficiency Standards of Residential and Nonresidential Buildings, Title 24, Part 6. In an embodiment, the photovoltaic module 10 meets the standards of California Building Energy Efficiency Standards of Residential and Nonresidential Buildings, Title 24, Part 6. In an embodiment, the photovoltaic module 10 when electrically inactive is not electrically connected to an electrical system or any other electrical components of a solar roofing system. In an embodiment, the photovoltaic module 10 when electrically inactive does not include any of the at least one solar cell 12. In an embodiment, the photovoltaic module 10 when electrically inactive includes a solar reflectivity index (SRI) of 16. In an embodiment, the photovoltaic module 10 when electrically inactive includes a solar reflectivity index (SRI) of greater than 16.

Referring to FIG. 3, in an embodiment, a method of making the photovoltaic module 10 includes a first lamination step and a second lamination step. In an embodiment, the first lamination step includes laminating the layers of the frontsheet 16. In an embodiment, the first lamination step includes laminating the glass layer 18, the light scattering encapsulant layer 20, the polymer layer 22, and the adhesive layer 24. In an embodiment, the first lamination step includes laminating the glass layer 18, the light scattering encapsulant layer 20, the polymer layer 22, the adhesive layer 24, and the embossing layer 34. In an embodiment, the method includes the step of removing the embossing layer 34 after the first lamination step. In an embodiment, the second lamination step includes laminating the frontsheet 16 with the remaining layers of the photovoltaic module 10. In an embodiment, the second lamination step includes laminating the frontsheet 16, the encapsulant 14, the at least one solar cell 12, and the backsheet 38.

Figure 4:
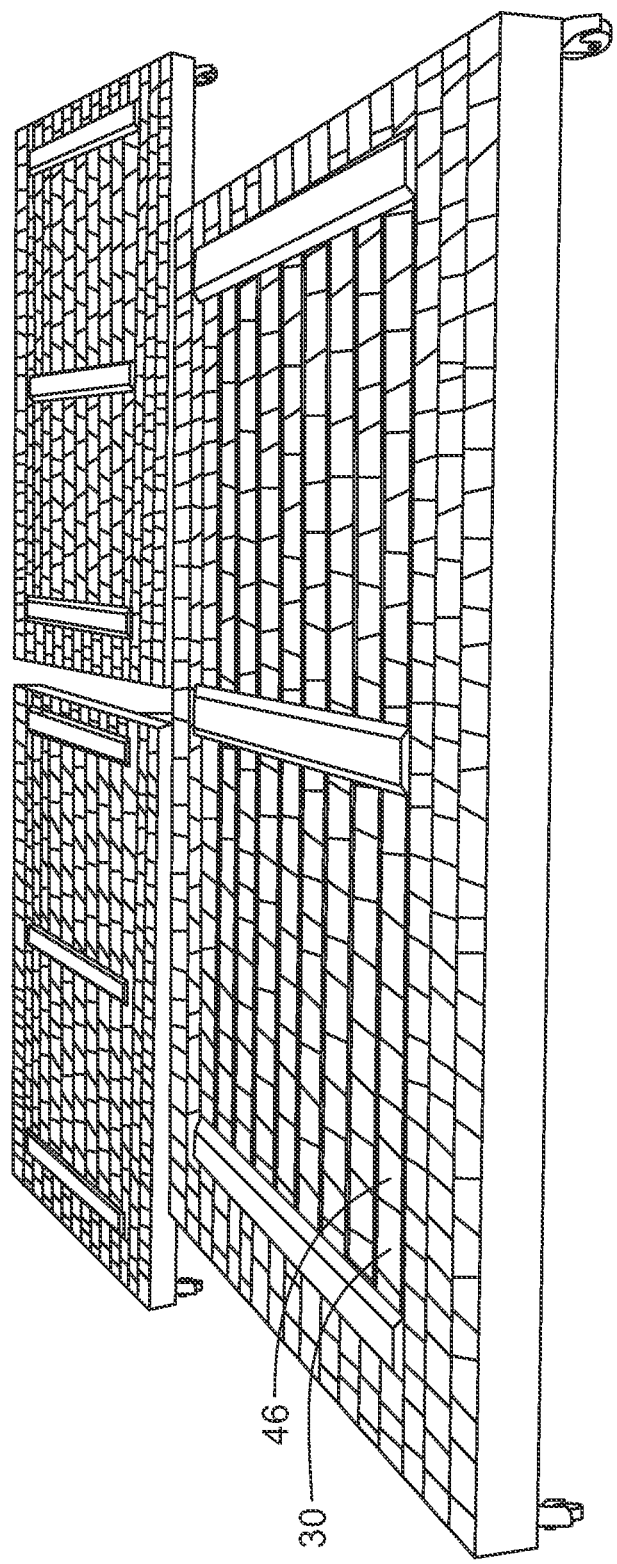
FIG. 4 shows a roofing system employing a plurality of the photovoltaic shingle shown in FIG. 1 installed on a roof deck.

Referring to FIG. 4, in an embodiment, a system includes a plurality of the photovoltaic modules 10 installed on a roof deck 100. In an embodiment, a first one of the photovoltaic modules 10 overlays a second one of the photovoltaic modules 10. In an embodiment, a reveal portion of the photovoltaic modules 10 includes the portions 30 and at least one portion 46 defined by the at least one area 32 of the light scattering encapsulant layer 20 thereof. In an embodiment, the at least one portion 46 includes a plurality of the portions 46.

In some embodiments, a light scattering value of each of the portions 46 can be quantified in accordance with the ASTM D1003 Standard Test Method for Haze and Luminous Transmittance of Transparent Plastics. In some embodiments, a light scattering value of each such portion 30 can be quantified in accordance with the ASTM E430 Standard Test Methods for Measurement of Gloss of High-Gloss Surfaces by Abridged Goniophotometry. In some embodiments, a light scattering value of each such portion 46 can be quantified in accordance with ISO 13803 standard-Paints and Varnishes—Determination of Haze on Paint Films at 20°. In an embodiment, the light scattering value of the portions 46 are measured in haze units (HU).

In an embodiment, the light scattering value of the at least one portion 46 of the light scattering encapsulant layer 20 is 0.1 HU to 12 HU. In an embodiment, the light scattering value of the at least one portion 46 of the light scattering encapsulant layer 20 is 0.1 HU to 11 HU. In an embodiment, the light scattering value of the at least one portion 46 of the light scattering encapsulant layer 20 is 0.1 HU to 10 HU. In an embodiment, the light scattering value of the at least one portion 46 of the light scattering encapsulant layer 20 is 0.1 HU to 9 HU. In an embodiment, the light scattering value of the at least one portion 46 of the light scattering encapsulant layer 20 is 0.1 HU to 8 HU. In an embodiment, the light scattering value of the at least one portion 46 of the light scattering encapsulant layer 20 is 0.1 HU to 7 HU. In an embodiment, the light scattering value of the at least one portion 46 of the light scattering encapsulant layer 20 is 0.1 HU to 6 HU. In an embodiment, the light scattering value of the at least one portion 46 of the light scattering encapsulant layer 20 is 0.1 HU to 5 HU. In an embodiment, the light scattering value of the at least one portion 46 of the light scattering encapsulant layer 20 is 0.1 HU to 4 HU. In an embodiment, the light scattering value of the at least one portion 46 of the light scattering encapsulant layer 20 is 0.1 HU to 3 HU. In an embodiment, the light scattering value of the at least one portion 46 of the light scattering encapsulant layer 20 is 0.1 HU to 2 HU. In an embodiment, the light scattering value of the at least one portion 46 of the light scattering encapsulant layer 20 is 0.1 HU to 1 HU. In an embodiment, the light scattering value of the at least one portion 46 of the light scattering encapsulant layer 20 is 0.1 HU to 0.5 HU.

In an embodiment, the light scattering value of the at least one portion 46 of the light scattering encapsulant layer 20 is 0.5 HU to 12 HU. In an embodiment, the light scattering value of the at least one portion 46 of the light scattering encapsulant layer 20 is 0.5 HU to 11 HU. In an embodiment, the light scattering value of the at least one portion 46 of the light scattering encapsulant layer 20 is 0.5 HU to 10 HU. In an embodiment, the light scattering value of the at least one portion 46 of the light scattering encapsulant layer 20 is 0.5 HU to 9 HU. In an embodiment, the light scattering value of the at least one portion 46 of the light scattering encapsulant layer 20 is 0.5 HU to 8 HU. In an embodiment, the light scattering value of the at least one portion 46 of the light scattering encapsulant layer 20 is 0.5 HU to 7 HU. In an embodiment, the light scattering value of the at least one portion 46 of the light scattering encapsulant layer 20 is 0.5 HU to 6 HU. In an embodiment, the light scattering value of the at least one portion 46 of the light scattering encapsulant layer 20 is 0.5 HU to 5 HU. In an embodiment, the light scattering value of the at least one portion 46 of the light scattering encapsulant layer 20 is 0.5 HU to 4 HU. In an embodiment, the light scattering value of the at least one portion 46 of the light scattering encapsulant layer 20 is 0.5 HU to 3 HU. In an embodiment, the light scattering value of the at least one portion 46 of the light scattering encapsulant layer 20 is 0.5 HU to 2 HU. In an embodiment, the light scattering value of the at least one portion 46 of the light scattering encapsulant layer 20 is 0.5 HU to 1 HU.

In an embodiment, the light scattering value of the at least one portion 46 of the light scattering encapsulant layer 20 is 1 HU to 12 HU. In an embodiment, the light scattering value of the at least one portion 46 of the light scattering encapsulant layer 20 is 1 HU to 11 HU. In an embodiment, the light scattering value of the at least one portion 46 of the light scattering encapsulant layer 20 is 1 HU to 10 HU. In an embodiment, the light scattering value of the at least one portion 46 of the light scattering encapsulant layer 20 is 1 HU to 9 HU. In an embodiment, the light scattering value of the at least one portion 46 of the light scattering encapsulant layer 20 is 1 HU to 8 HU. In an embodiment, the light scattering value of the at least one portion 46 of the light scattering encapsulant layer 20 is 1 HU to 7 HU. In an embodiment, the light scattering value of the at least one portion 46 of the light scattering encapsulant layer 20 is 1 HU to 6 HU. In an embodiment, the light scattering value of the at least one portion 46 of the light scattering encapsulant layer 20 is 1 HU to 5 HU. In an embodiment, the light scattering value of the at least one portion 46 of the light scattering encapsulant layer 20 is 1 HU to 4 HU. In an embodiment, the light scattering value of the at least one portion 46 of the light scattering encapsulant layer 20 is 1 HU to 3 HU. In an embodiment, the light scattering value of the at least one portion 46 of the light scattering encapsulant layer 20 is 1 HU to 2 HU.

In an embodiment, the light scattering value of the at least one portion 46 of the light scattering encapsulant layer 20 is 2 HU to 12 HU. In an embodiment, the light scattering value of the at least one portion 46 of the light scattering encapsulant layer 20 is 2 HU to 11 HU. In an embodiment, the light scattering value of the at least one portion 46 of the light scattering encapsulant layer 20 is 2 HU to 10 HU. In an embodiment, the light scattering value of the at least one portion 46 of the light scattering encapsulant layer 20 is 2 HU to 9 HU. In an embodiment, the light scattering value of the at least one portion 46 of the light scattering encapsulant layer 20 is 2 HU to 8 HU. In an embodiment, the light scattering value of the at least one portion 46 of the light scattering encapsulant layer 20 is 2 HU to 7 HU. In an embodiment, the light scattering value of the at least one portion 46 of the light scattering encapsulant layer 20 is 2 HU to 6 HU. In an embodiment, the light scattering value of the at least one portion 46 of the light scattering encapsulant layer 20 is 2 HU to 5 HU. In an embodiment, the light scattering value of the at least one portion 46 of the light scattering encapsulant layer 20 is 2 HU to 4 HU. In an embodiment, the light scattering value of the at least one portion 46 of the light scattering encapsulant layer 20 is 2 HU to 3 HU.

In an embodiment, the light scattering value of the at least one portion 46 of the light scattering encapsulant layer 20 is 3 HU to 12 HU. In an embodiment, the light scattering value of the at least one portion 46 of the light scattering encapsulant layer 20 is 3 HU to 11 HU. In an embodiment, the light scattering value of the at least one portion 46 of the light scattering encapsulant layer 20 is 3 HU to 10 HU. In an embodiment, the light scattering value of the at least one portion 46 of the light scattering encapsulant layer 20 is 3 HU to 9 HU. In an embodiment, the light scattering value of the at least one portion 46 of the light scattering encapsulant layer 20 is 3 HU to 8 HU. In an embodiment, the light scattering value of the at least one portion 46 of the light scattering encapsulant layer 20 is 3 HU to 7 HU. In an embodiment, the light scattering value of the at least one portion 46 of the light scattering encapsulant layer 20 is 3 HU to 6 HU. In an embodiment, the light scattering value of the at least one portion 46 of the light scattering encapsulant layer 20 is 3 HU to 5 HU. In an embodiment, the light scattering value of the at least one portion 46 of the light scattering encapsulant layer 20 is 3 HU to 4 HU.

In an embodiment, the light scattering value of the at least one portion 46 of the light scattering encapsulant layer 20 is 4 HU to 12 HU. In an embodiment, the light scattering value of the at least one portion 46 of the light scattering encapsulant layer 20 is 4 HU to 11 HU. In an embodiment, the light scattering value of the at least one portion 46 of the light scattering encapsulant layer 20 is 4 HU to 10 HU. In an embodiment, the light scattering value of the at least one portion 46 of the light scattering encapsulant layer 20 is 4 HU to 9 HU. In an embodiment, the light scattering value of the at least one portion 46 of the light scattering encapsulant layer 20 is 4 HU to 8 HU. In an embodiment, the light scattering value of the at least one portion 46 of the light scattering encapsulant layer 20 is 4 HU to 7 HU. In an embodiment, the light scattering value of the at least one portion 46 of the light scattering encapsulant layer 20 is 4 HU to 6 HU. In an embodiment, the light scattering value of the at least one portion 46 of the light scattering encapsulant layer 20 is 4 HU to 5 HU.

In an embodiment, the light scattering value of the at least one portion 46 of the light scattering encapsulant layer 20 is 5 HU to 12 HU. In an embodiment, the light scattering value of the at least one portion 46 of the light scattering encapsulant layer 20 is 5 HU to 11 HU. In an embodiment, the light scattering value of the at least one portion 46 of the light scattering encapsulant layer 20 is 5 HU to 10 HU. In an embodiment, the light scattering value of the at least one portion 46 of the light scattering encapsulant layer 20 is 5 HU to 9 HU. In an embodiment, the light scattering value of the at least one portion 46 of the light scattering encapsulant layer 20 is 5 HU to 8 HU. In an embodiment, the light scattering value of the at least one portion 46 of the light scattering encapsulant layer 20 is 5 HU to 7 HU. In an embodiment, the light scattering value of the at least one portion 46 of the light scattering encapsulant layer 20 is 5 HU to 6 HU.

In an embodiment, the light scattering value of the at least one portion 46 of the light scattering encapsulant layer 20 is 6 HU to 12 HU. In an embodiment, the light scattering value of the at least one portion 46 of the light scattering encapsulant layer 20 is 6 HU to 11 HU. In an embodiment, the light scattering value of the at least one portion 46 of the light scattering encapsulant layer 20 is 6 HU to 10 HU. In an embodiment, the light scattering value of the at least one portion 46 of the light scattering encapsulant layer 20 is 6 HU to 9 HU. In an embodiment, the light scattering value of the at least one portion 46 of the light scattering encapsulant layer 20 is 6 HU to 8 HU. In an embodiment, the light scattering value of the at least one portion 46 of the light scattering encapsulant layer 20 is 6 HU to 7 HU.

In an embodiment, the light scattering value of the at least one portion 46 of the light scattering encapsulant layer 20 is 7 HU to 12 HU. In an embodiment, the light scattering value of the at least one portion 46 of the light scattering encapsulant layer 20 is 7 HU to 11 HU. In an embodiment, the light scattering value of the at least one portion 46 of the light scattering encapsulant layer 20 is 7 HU to 10 HU. In an embodiment, the light scattering value of the at least one portion 46 of the light scattering encapsulant layer 20 is 7 HU to 9 HU. In an embodiment, the light scattering value of the at least one portion 46 of the light scattering encapsulant layer 20 is 7 HU to 8 HU. In an embodiment, the light scattering value of the at least one portion 46 of the light scattering encapsulant layer 20 is 8 HU to 12 HU. In an embodiment, the light scattering value of the at least one portion 46 of the light scattering encapsulant layer 20 is 8 HU to 11 HU. In an embodiment, the light scattering value of the at least one portion 46 of the light scattering encapsulant layer 20 is 8 HU to 10 HU. In an embodiment, the light scattering value of the at least one portion 46 of the light scattering encapsulant layer 20 is 8 HU to 9 HU.

In an embodiment, the light scattering value of the at least one portion 46 of the light scattering encapsulant layer 20 is 9 HU to 12 HU. In an embodiment, the light scattering value of the at least one portion 46 of the light scattering encapsulant layer 20 is 9 HU to 11 HU. In an embodiment, the light scattering value of the at least one portion 46 of the light scattering encapsulant layer 20 is 9 HU to 10 HU. In an embodiment, the light scattering value of the at least one portion 46 of the light scattering encapsulant layer 20 is 10 HU to 12 HU. In an embodiment, the light scattering value of the at least one portion 46 of the light scattering encapsulant layer 20 is 10 HU to 11 HU. In an embodiment, the light scattering value of the at least one portion 46 of the light scattering encapsulant layer 20 is 11 HU to 12 HU.

In an embodiment, the light scattering value of the at least one portion 46 of the light scattering encapsulant layer 20 is 0.1 HU. In an embodiment, the light scattering value of the at least one portion 46 of the light scattering encapsulant layer 20 is 0.5 HU. In an embodiment, the light scattering value of the at least one portion 46 of the light scattering encapsulant layer 20 is 1 HU. In an embodiment, the light scattering value of the at least one portion 46 of the light scattering encapsulant layer 20 is 2 HU. In an embodiment, the light scattering value of the at least one portion 46 of the light scattering encapsulant layer 20 is 3 HU. In an embodiment, the light scattering value of the at least one portion 46 of the light scattering encapsulant layer 20 is 4 HU. In an embodiment, the light scattering value of the at least one portion 46 of the light scattering encapsulant layer 20 is 5 HU. In an embodiment, the light scattering value of the at least one portion 46 of the light scattering encapsulant layer 20 is 6 HU. In an embodiment, the light scattering value of the at least one portion 46 of the light scattering encapsulant layer 20 is 7 HU. In an embodiment, the light scattering value of the at least one portion 46 of the light scattering encapsulant layer 20 is 8 HU. In an embodiment, the light scattering value of the at least one portion 46 of the light scattering encapsulant layer 20 is 9 HU. In an embodiment, the light scattering value of the at least one portion 46 of the light scattering encapsulant layer 20 is 10 HU. In an embodiment, the light scattering value of the at least one portion 46 of the light scattering encapsulant layer 20 is 11 HU. In an embodiment, the light scattering value of the at least one portion 46 of the light scattering encapsulant layer 20 is 12 HU.

In an embodiment, the light scattering value of the at least one portion 46 is different from the light scattering value of the at least one portion 30 of the light scattering encapsulant layer 20. In an embodiment, the appearance and color of the portions 30 are different from those of the portions 46. In an embodiment, the portions 30 are lighter in appearance and color than those of the portions 46 to mimic the appearance of a standard roofing shingle (e.g., an asphalt shingle). In an embodiment, the first layer 40 of the backsheet 38 is black in color. In an embodiment, the black color of the first layer 40 of the backsheet 38 evokes an appearance and a color that is darker than those of the portions 30.

Figure 5:
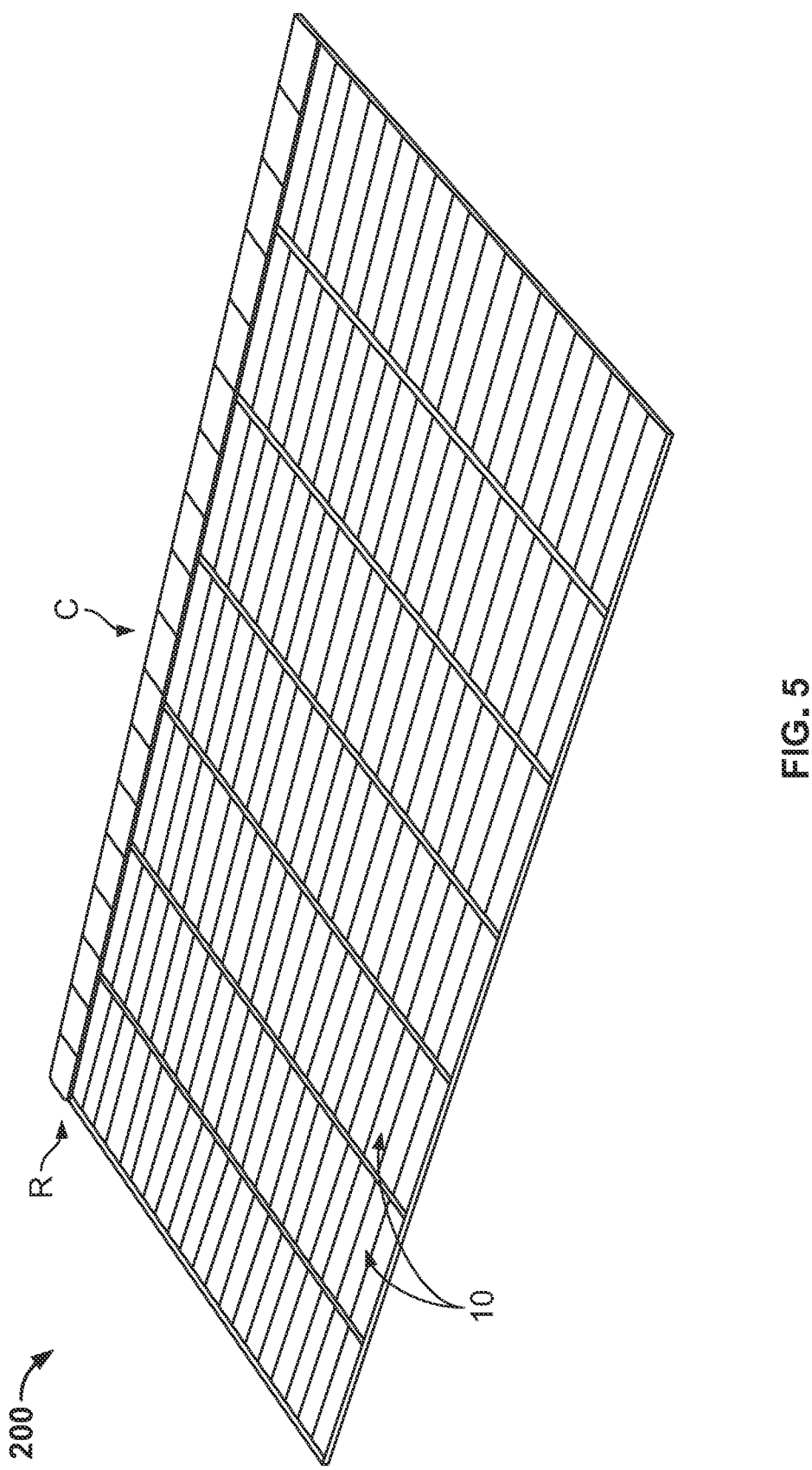
FIG. 5 shows an embodiment of a roofing system employing a plurality of photovoltaic shingles.

Referring to FIG. 5, in an embodiment, a photovoltaic system 200 includes a plurality of the photovoltaic modules 10. In an embodiment, the photovoltaic system 200 is installed on a roof deck. In an embodiment, the photovoltaic modules 10 are arranged in an array. In an embodiment, the array includes a plurality of columns C and a plurality of rows R. In an embodiment, a light-scattering value of one of the photovoltaic modules 10 is different from a light-scattering value of another one of the photovoltaic modules 10. In an embodiment, each of the photovoltaic modules 10 includes a light-scattering value which, collectively, impart a random-seeming appearance of the photovoltaic system 200. In an embodiment, the light-scattering value of one of the photovoltaic modules 10 located in one of the columns C is different than the light-scattering value of at least an adjacent one of the photovoltaic modules 10 located in such column C. In another embodiment, the light-scattering value of one of the photovoltaic modules 10 located in one of the columns C is the same as the light-scattering value of at least an adjacent one of the photovoltaic modules 10 located in such column C. In another embodiment, the light-scattering value of one of the photovoltaic modules 10 located in one of the columns C is substantially the same as the light-scattering value of at least an adjacent one of the photovoltaic modules 10 located in such column C. In an embodiment, each of the photovoltaic modules 10 located in one of the columns C includes a light-scattering value that is different from the light-scattering value of the remaining photovoltaic modules 10 in such column C. In an embodiment, each of a plurality of the photovoltaic modules 10 located in one of the columns C includes an identical light-scattering value. In an embodiment, each of a plurality of the photovoltaic modules 10 located in one of the columns C includes a light-scattering value that is substantially similar to one another.

In an embodiment, the light-scattering value of one of the photovoltaic modules 10 located in one of the rows R is different than the light-scattering value of at least an adjacent one of the photovoltaic modules 10 located in such row R. In another embodiment, the light-scattering value of one of the photovoltaic modules 10 located in one of the rows R is the same as the light-scattering value of at least an adjacent one of the photovoltaic modules 10 located in such row R. In another embodiment, the light-scattering value of one of the photovoltaic modules 10 located in one of the rows R is substantially the same as the light-scattering value of at least an adjacent one of the photovoltaic modules 10 located in such row R. In an embodiment, each of the photovoltaic modules 10 located in one of the rows R includes a light-scattering value that is different from the light-scattering value of the remaining photovoltaic modules 10 in such row R. In an embodiment, each of a plurality of the photovoltaic modules 10 located in one of the rows R includes an identical light-scattering value. In an embodiment, each of a plurality of the photovoltaic modules 10 located in one of the rows R includes a light-scattering value that is substantially similar to one another.

In some embodiments, a method of making the photovoltaic module 10, comprises the steps of:
  obtaining the frontsheet 16, wherein the frontsheet includes the glass layer 18, the light scattering encapsulant layer 20 and the polymer layer 22; and
  laminating the frontsheet 16, the encapsulant 14, the at least one solar cell 12, and the backsheet 38.

In some embodiments, a method of making the photovoltaic module 10, comprises the steps of:
  obtaining the frontsheet 16, wherein the frontsheet includes the glass layer 18, the light scattering encapsulant layer 20, the adhesive layer 24, and the polymer layer 22; and laminating the frontsheet 16, the encapsulant 14, the at least one solar cell 12, and the backsheet 38.

In some embodiments, a method of making the photovoltaic module 10, comprises the steps of:
  laminating the glass layer 18, the light scattering encapsulant layer 20 and the polymer layer 22 to form the frontsheet 16; and
  laminating the frontsheet 16, the encapsulant 14, the at least one solar cell 12, and the backsheet 38.

In some embodiments, a method of making the photovoltaic module 10, comprises the steps of:
  laminating the glass layer 18, the light scattering encapsulant layer 20, the adhesive layer 24, and the polymer layer 22 to form the frontsheet 16; and
  laminating the frontsheet 16, the encapsulant 14, the at least one solar cell 12, and the backsheet 38.

In some embodiments, a method of making the photovoltaic module 10, comprises the steps of:
  laminating the glass layer 18 and the light scattering encapsulant layer 20;
  laminating the polymer layer 22 with the laminated glass layer 18 and light scattering encapsulant layer 20 to form the frontsheet 16; and
  laminating the frontsheet 16, the encapsulant 14, the at least one solar cell 12, and the backsheet 38.

In some embodiments, a method of making the photovoltaic module 10, comprises the steps of:
  laminating the glass layer 18 and the light scattering encapsulant layer 20;
  laminating the polymer layer 22 and the adhesive layer 24 with the laminated glass layer 18 and light scattering encapsulant layer 20 to form the frontsheet 16; and
  laminating the frontsheet 16, the encapsulant 14, the at least one solar cell 12, and the backsheet 38.

In some embodiments, a method of making the photovoltaic module 10, comprises the steps of:
  obtaining the frontsheet 16, wherein the frontsheet includes the glass layer 18, the light scattering encapsulant layer 20 and the polymer layer 22;
  laminating the first layer 40, the second layer 42 and the adhesive layer 44 to form the backsheet 38; and
  laminating the frontsheet 16, the encapsulant 14, the at least one solar cell 12, and the backsheet 38.

In some embodiments, a method of making the photovoltaic module 10, comprises the steps of:
  obtaining the frontsheet 16, wherein the frontsheet includes the glass layer 18, the light scattering encapsulant layer 20, the adhesive layer 24, and the polymer layer 22;
  laminating the first layer 40, the second layer 42 and the adhesive layer 44 to form the backsheet 38; and
  laminating the frontsheet 16, the encapsulant 14, the at least one solar cell 12, and the backsheet 38.

In some embodiments, a method of making the photovoltaic module 10, comprises the steps of:
  laminating the glass layer 18, the light scattering encapsulant layer 20 and the polymer layer 22 to form the frontsheet 16;
  laminating the first layer 40, the second layer 42 and the adhesive layer 44 to form the backsheet 38; and
  laminating the frontsheet 16, the encapsulant 14, the at least one solar cell 12, and the backsheet 38.

In some embodiments, a method of making the photovoltaic module 10, comprises the steps of:
  laminating the glass layer 18, the light scattering encapsulant layer 20, the adhesive layer 24, and the polymer layer 22 to form the frontsheet 16;
  laminating the first layer 40, the second layer 42 and the adhesive layer 44 to form the backsheet 38; and
  laminating the frontsheet 16, the encapsulant 14, the at least one solar cell 12, and the backsheet 38.

In some embodiments, a method of making the photovoltaic module 10, comprises the steps of:
  laminating the glass layer 18 and the light scattering encapsulant layer 20;
  laminating the polymer layer 22 with the laminated glass layer 18 and light scattering encapsulant layer 20 to form the frontsheet 16;
  laminating the first layer 40, the second layer 42 and the adhesive layer 44 to form the backsheet 38; and
  laminating the frontsheet 16, the encapsulant 14, the at least one solar cell 12, and the backsheet 38.

In some embodiments, a method of making the photovoltaic module 10, comprises the steps of:
  laminating the glass layer 18 and the light scattering encapsulant layer 20;
  laminating the polymer layer 22 and the adhesive layer 24 with the laminated glass layer 18 and light scattering encapsulant layer 20 to form the frontsheet 16;
  laminating the first layer 40, the second layer 42 and the adhesive layer 44 to form the backsheet 38; and
  laminating the frontsheet 16, the encapsulant 14, the at least one solar cell 12, and the backsheet 38.

What is claimed is:

1. A method of making a photovoltaic module, comprising the steps of:
  obtaining a frontsheet, wherein the frontsheet includes
    a glass layer having a first surface,
    a light scattering encapsulant layer having a first surface and a second surface opposite the first surface of the light scattering encapsulant layer,
      wherein the second surface of the light scattering encapsulant layer is attached to the first surface of the glass layer,
      wherein the light scattering encapsulant layer includes a first region, a plurality of first portions extending from the first region, and at least one area located between the first portions,
    a polymer layer having a first surface and a second surface opposite the first surface of the polymer layer, wherein the second surface of the polymer layer is attached to the first surface of the light scattering encapsulant layer, and
    wherein the plurality of first portions of the light scattering encapsulant layer has a first light scattering value as measured in accordance with an ASTM E430 standard,
    wherein a second portion defined by the at least one area has a second light scattering value as measured in accordance with the ASTM E430 standard,
    and wherein the second light scattering value is different than the first light scattering value;
  obtaining at least one solar cell, an encapsulant, and a backsheet
    wherein the encapsulant includes a first surface and a second surface opposite the first surface of the encapsulant; and
  laminating the frontsheet, the encapsulant, the at least one solar cell, and the backsheet,
    wherein the frontsheet is juxtaposed with the first surface of the encapsulant,
    wherein the encapsulant encapsulates the at least one solar cell, and wherein the backsheet is juxtaposed with the second surface of the encapsulant.

2. The method of claim 1, further comprising the steps of laminating the glass layer, the light scattering encapsulant layer, and the polymer layer to form the frontsheet.

3. The method of claim 1, wherein the first light scattering value is 0.1 HU to 12 HU.

4. The method of claim 1, wherein the second light scattering value is 0.1 HU to 12 HU.

5. The method of claim 1, wherein the polymer layer is attached to the light scattering encapsulant layer by an adhesive layer.

6. The method of claim 5, wherein the adhesive layer is selected from the group consisting of thermosetting polyolefin, thermosetting polyolefin encapsulant material, ethylene-vinyl acetate (EVA), EVA encapsulants, thermoplastic olefin, thermoplastic polyolefin (TPO) and hybrids and combinations thereof.

7. The method of claim 5, wherein the adhesive layer includes a thermosetting polyolefin encapsulant material.

8. The method of claim 1, wherein the polymer layer includes a fluoropolymer.

9. The method of claim 1, wherein the polymer layer includes a material selected from the group consisting of acrylics, polyesters, silicones, and polycarbonates.

10. The method of claim 1, wherein the light scattering encapsulant layer includes a polymeric material.

11. The method of claim 10, wherein the polymeric material includes at least one of ethylene-co-vinyl acetate, polydimethyl siloxane, a polyolefin elastomer, or a combination thereof.

12. The method of claim 11, wherein the backsheet includes a first layer juxtaposed with the second surface of the encapsulant.

13. The method of claim 12, wherein the first layer includes thermoplastic polyolefin (TPO).

14. The method of claim 12, wherein the backsheet includes a second layer.

15. The method of claim 14, wherein the second layer includes thermoplastic polyolefin (TPO).

16. The method of claim 15, wherein the first layer is attached to the second layer by a second adhesive layer.

17. The method of claim 16, wherein the second adhesive layer is selected from the group consisting of thermosetting polyolefin, thermosetting polyolefin encapsulant material, thermosetting polyolefin encapsulant material, ethylene-vinyl acetate (EVA), EVA encapsulants, thermoplastic olefin, thermoplastic polyolefin (TPO) and hybrids and combinations thereof.

18. A system, comprising:
- a plurality of photovoltaic modules installed on a roof deck, wherein each of the photovoltaic modules includes
- at least one solar cell;
- an encapsulant encapsulating the at least one solar cell; and
- a frontsheet juxtaposed with the encapsulant,
- wherein the frontsheet includes
  - a glass layer having a first surface,
  - a light scattering encapsulant layer having a first surface and a second surface opposite the first surface of the light scattering encapsulant layer,
    - wherein the second surface of the light scattering encapsulant layer is attached to the first surface of the glass layer,
    - wherein the light scattering encapsulant layer includes a first region, a plurality of first portions extending from the first region, and at least one area located between the first portions,
  - a polymer layer having a first surface and a second surface opposite the first surface of the polymer layer, wherein the second surface of the polymer layer is attached to the first surface of the light scattering encapsulant layer, and
  - wherein the plurality of first portions of the light scattering encapsulant layer has a first light scattering value as measured in accordance with an ASTM E430 standard,
  - wherein a second portion defined by the at least one area has a second light scattering value as measured in accordance with the ASTM E430 standard,
  - and wherein the second light scattering value is different than the first light scattering value.

19. The system of claim 18, wherein at least one of the photovoltaic modules has a solar reflectivity index (SRI) greater than 16.

20. The system of claim 18, wherein the difference between the first light scattering value and the second light scattering value imparts a random appearance to the system.

* * * * *